(12) United States Patent
Satoh

(10) Patent No.: US 6,519,761 B1
(45) Date of Patent: Feb. 11, 2003

(54) PHOTOMASK DESIGNING METHOD, A PHOTOMASK DESIGNING APPARATUS, A COMPUTER READABLE STORAGE MEDIUM, A PHOTOMASK, A PHOTORESIST, PHOTOSENSITIVE RESIN, A BASE PLATE, A MICROLENS, AND AN OPTICAL ELEMENT

(75) Inventor: Yasuhiro Satoh, Natori (JP)

(73) Assignee: Ricoh Company, Ltd., Tokyo (JP)

( * ) Notice: Subject to any disclaimer, the term of this patent is extended or adjusted under 35 U.S.C. 154(b) by 204 days.

(21) Appl. No.: 09/657,145

(22) Filed: Sep. 7, 2000

(30) Foreign Application Priority Data

Sep. 7, 1999 (JP) ............................ 11-252507
Jun. 29, 2000 (JP) ........................ 2000-195724

(51) Int. Cl.$^7$ .................... G06F 17/50; G03F 9/00; G03C 3/00; G03C 5/00; H01L 21/00
(52) U.S. Cl. ................ 716/21; 438/69; 430/5; 430/18; 430/311; 430/312; 430/322; 430/326
(58) Field of Search .................. 430/311; 438/784, 438/462, 738, 239, 311, 197, 459, 322, 5, 129, 325

(56) References Cited

U.S. PATENT DOCUMENTS

| | | | | | |
|---|---|---|---|---|---|
| 4,735,890 A | * | 4/1988 | Nakane | .................. | 430/311 |
| 5,100,508 A | * | 3/1992 | Yoshida et al. | .............. | 430/312 |
| 5,219,686 A | * | 6/1993 | Kamon | .......................... | 430/5 |
| 5,286,605 A | * | 2/1994 | Nishioka et al. | ............. | 430/311 |
| 5,340,702 A | * | 8/1994 | Hirasawa et al. | ........... | 430/326 |
| 5,422,285 A | * | 6/1995 | Ishibe | ........................ | 438/69 |
| 5,750,316 A | * | 5/1998 | Kawamura et al. | ......... | 430/311 |
| 5,879,839 A | * | 3/1999 | Jung et al. | ...................... | 430/5 |
| 5,902,716 A | * | 5/1999 | Owa et al. | .................. | 430/312 |
| 5,948,578 A | * | 9/1999 | Kurata et al. | ................. | 430/18 |
| 2001/0044080 A1 | * | 11/2001 | Iguchi et al. | ............... | 430/322 |

\* cited by examiner

*Primary Examiner*—Matthew Smith
*Assistant Examiner*—Andrea Liu
(74) *Attorney, Agent, or Firm*—Oblon, Spivak, McClelland, Maier & Neustadt, P.C.

(57) ABSTRACT

A photomask designing method and apparatus, a computer readable storing medium, a photomask, a photoresist, a photosensitive resin, a base plate, a microlens, and an optical element. In the method, even though a desired depth of a photoresist pattern and a type of the photoresist are changed, the photomask can be easily designed. In a method of designing a photomask in which intensity of light radiated onto the photoresist is controlled with a fine pattern, that is, a congregation of fine areas respectively having predetermined light transmission factor, the resist sensitivity curve showing resist depth for the exposing amount of the employed photoresist and fine areas data corresponding to plural light transmission factors per determined halftone are previously set, and then, the depth of the resist respectively set per each of the fine areas is converted to the light exposing amount by use of the resist sensitivity curve. The converted exposing amount is further converted to the light transmission factor. The light transmission factor is replaced by the fine areas data. In such a way, a concrete fine pattern can be created.

51 Claims, 19 Drawing Sheets

FIG. 6

| y (μm) \ x (μm) | 2 | 6 | 10 | 14 | 18 | 22 | 26 | 30 | 34 | 38 | 42 |
|---|---|---|---|---|---|---|---|---|---|---|---|
| 2 | -20 | -20 | -19 | -18 | -17 | -15 | -14 | -12 | -9.6 | -7.3 | -5 |
| 6 | -20 | -19 | -19 | -18 | -17 | -15 | -13 | -12 | -9.4 | -7.1 | -5 |
| 10 | -19 | -19 | -18 | -17 | -16 | -15 | -13 | -11 | -8.9 | -6.6 | -5 |
| 14 | -18 | -18 | -17 | -16 | -15 | -14 | -12 | -10 | -8.1 | -5.8 | -5 |
| 18 | -17 | -17 | -16 | -15 | -14 | -13 | -11 | -9.1 | -7.1 | -5 | -5 |
| 22 | -15 | -15 | -15 | -14 | -13 | -11 | -9.6 | -7.8 | -5.8 | -5 | -5 |
| 26 | -14 | -13 | -13 | -12 | -11 | -9.6 | -8.1 | -6.3 | -5 | -5 | -5 |
| 30 | -12 | -12 | -11 | -10 | -9.1 | -7.8 | -6.3 | -5 | -5 | -5 | -5 |
| 34 | -9.6 | -9.4 | -8.9 | -8.1 | -7.1 | -5.8 | -5 | -5 | -5 | -5 | -5 |
| 38 | -7.3 | -7.1 | -6.6 | -5.8 | -5 | -5 | -5 | -5 | -5 | -5 | -5 |
| 42 | -5 | -5 | -5 | -5 | -5 | -5 | -5 | -5 | -5 | -5 | -5 |

PHOTOMASK DESIGNING METHOD, A PHOTOMASK DESIGNING APPARATUS, A COMPUTER READABLE STORAGE MEDIUM, A PHOTOMASK, A PHOTORESIST, PHOTOSENSITIVE RESIN, A BASE PLATE, A MICROLENS, AND AN OPTICAL ELEMENT

CROSS-REFERENCE TO RELATED DOCUMENTS

This document claims benefit of priority under 35 U.S.C. §119 to Japanese Patent Applications Nos. JPAP 11-252507 and JPAP 2000-195724 respectively filed in the Japanese Patent Office on Sep. 7, 1999, and on Jun. 29, 2000, the entire contents of which are hereby incorporated herein by reference.

BACKGROUND OF THE INVENTION

1. Field of the Invention

The present invention relates to a photomask employed for manufacturing a micro-machine, a microlens, etc., a photomask designing method, a photomask designing apparatus, and a computer readable storage medium.

The present invention further relates to a photoresist manufactured by use of the photomask, photosensitive resin, a base plate microlens, and an optical element.

2. Discussion of the Background

In order to use a photomask for manufacturing a miniature optical element, a technology has been developed in which a three-dimensional-shaped resist pattern as a replica is formed on a photoresist piled on a base material to be mechanically processed, and the base material is etched in accordance with the resist pattern, and thereby the base material can be processed in the same pattern as the resist pattern as the replica. For example, such technology has been already disclosed in Japanese Laid-open Patent Publication Nos. 7-63904, 8-21908, and 8-504515.

Regarding the method of making the complicated three-dimensional form by use of the photoresist, a method of giving the distribution of the light transmission factor to the photomask and controlling the depth of exposing the photoresist has been already studied. As to such a method as mentioned above, some controlling methods have been proposed; namely, a method of controlling the light transmission factor by forming a semi-transparent thin film on the photomask and a method of controlling the intensity of the transmitted light by arranging a large number of fine opening patterns and changing the square measure of the openings. In particular, according to the method of arranging a large number of fine opening patterns, the desired three-dimensional form can be made with the same method as that of mechanically processing the photomask usually employed for a semiconductor, etc. Therefore, the method can be practiced comparatively easily.

Japanese Laid-open Patent Publication No. 8-504515 discloses a system in which a photoresist is laminated on a base material to be processed as a lens, the lens desired to be formed on the base material is divided into fine plural areas, the distribution of the light transmission factor is given to the photomask in accordance with the thickness of the lens in the respective areas, and a desired three dimensional form is formed on the remaining film thickness of the photoresist exposed through the photomask. In the above laid-open patent application, the distribution of the light transmission factor is given to the photomask by the change of the opening rate in the fine area. Namely, the method of arranging a large number of fine opening patterns on the photomask and changing the square measure of the openings, and thereby controlling the intensity of the transmitted light, has been already adopted. An example of a resist pattern 102 formed by use of a photomask 101 is schematically shown in FIG. 16.

Furthermore, the article "Development of the dispersible microlens", Pure Appl. Opt. 3 (1994) 97–101, drafted by the same inventor as that of the Japanese Laid-open 8-504515 discloses that the fine area on the mask pattern is represented by the gray scale pattern 103 represented as an example as shown in FIGS. 17A through 17D. For instance, in the case of expressing 256 halftones, the gray scale pattern 103 of the 256 halftones is previously prepared, the data of the resist depth for the photoresist are taken per each gray scale pattern 103, and the relationship between the gray scale value and the resist depth is stored in a predetermined storage area. Refer to FIG. 18. And then, the photoresist is laminated on the base material to be processed as the lens, and the lens formed on the base material is divided into the fine plural areas. When the distribution of the light transmission factor is given to the photomask in accordance with the thickness of the lens in the respective areas, the gray scale pattern 103 having the gray scale value obtained from the graph of FIG. 16 is selected in accordance with the resist depth which is intended to be formed on the photoresist per each fine area.

SUMMARY OF THE INVENTION

According to the background arts, for instance, the arts disclosed in the background-art documents Japanese Laid-open Patent Publication Nos. 7-63904, 8-21908, and 8-504515, and other relevant documents, there exists no advantageous functional effect for improving the above-mentioned photomask design and storage medium.

The present invention has been made in view of the above-discussed and other problems and addresses the above-mentioned defects and troublesome matters of the background arts.

To state in more detail, when a complicated three-dimensional form is made by use of the photoresist, a large number of fine opening patterns are arranged on the photomask and the square measure of the openings is changed, and thereby the intensity of the transmitted light is controlled. Such a method has been already proposed, as mentioned before, as one of the methods of controlling the depth of exposing the photoresist by giving the distribution of the light transmission factor to the photomask. Moreover, as further mentioned before, the method of employing the graph showing the relationship between the gray scale value and the resist depth as exemplarily shown in FIG. 18 has been already proposed as the method of controlling the intensity of the transmitted light.

However, it is apparent from the graph of FIG. 18, even though the gray scale value is 256 halftones for example, since the resist depth if 0 (zero) in a part of the halftones, that is, a part of 0–70 halftones in the graph of FIG. 18, the number of the halftones capable of being used in practice turns out to be reduced. That is a problem to be solved. In addition, as shown in the graph of FIG. 18, since the variation of the resist depth for the gray scale value variation is large in the area of about 70–120 halftones, the resolution is lowered in that area. That is another problem to be solved.

Here, in order to increase the number of the usable halftones, it can be thought that the graph of the relationship between the gray scale value and the resist depth as shown in FIG. 18 corresponds to the resist depth. However, on this occasion, a graph has to be made again on the basis of the graph as shown in FIG. 18 every time the depth of the resist pattern to be formed on the photoresist is changed to another value. Furthermore, when the type of the employed photoresist is changed, and even if equal light intensity is given to the photoresist, the resist depth changes. For this reason, even on this occasion, the graph as shown in FIG. 18 has to be made again. In such a situation, the work of making again the graph signifies the necessity of taking again the basic data; those are, the data of the resist depth for the photoresist per each of the respective gray scale pattern 103. Therefore, the work of making the graph turns out to become very troublesome.

A primary object of the present invention is to easily design intensity of transmission light in a fine pattern of the photomask even though the depth of the desired photoresist pattern and the type of the photoresist are changed.

Another object of the present invention is to enable creating the three-dimensional resist pattern with the accuracy corresponding to the number of halftones of the transmission factor arranged on the photomask.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein:

FIG. 6 is a schematic table showing resist depth distribution data;

DETAILED DESCRIPTION OF THE PREFERRED EMBODIMENTS

Figure 1:
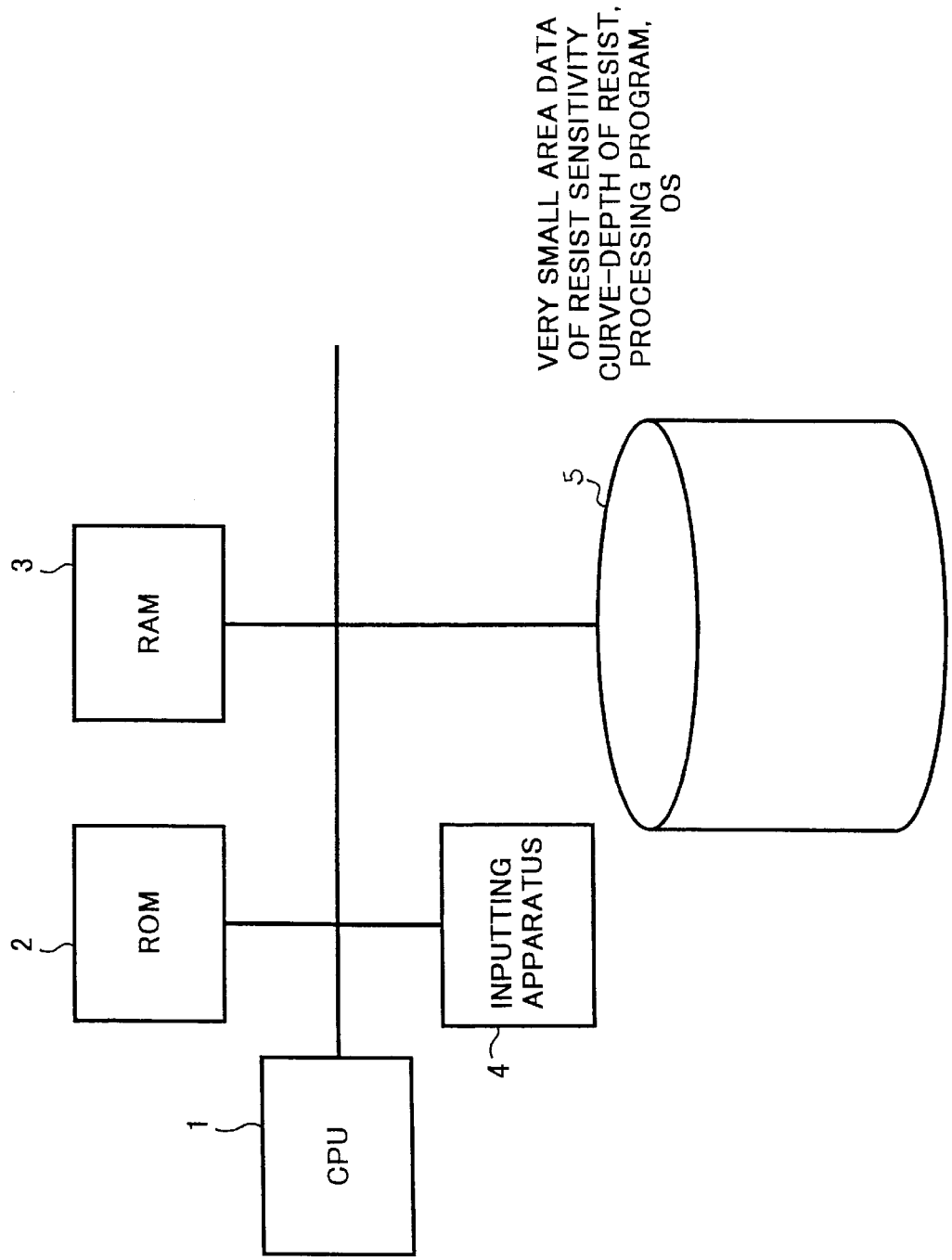
FIG. 1 is a block diagram illustrating a photomask designing apparatus of an embodiment according to the present invention.

In describing the preferred embodiments of the present invention illustrated in the accompanying drawings, specific terminology is employed for the sake of clarity. However, the present invention is not intended to be limited to the specific terminology so selected and it is to be understood that each specific element includes all technical equivalents which operate in a similar manner.

Referring now to the drawings, wherein like reference numerals designate identical or corresponding parts throughout the several views, and more particularly to FIGS. 1 through 15, a photomask designing apparatus, a computer readable storage medium, a photomask, a photoresist manufactured by use of the photomask, a photosensitive resin, a base plate, a microlens, and an optical element, according to the present invention are illustrated.

A first aspect of the present invention relates to a photomask designing method including the steps of a resist sensitivity curve setting process, a fine area data setting process, a resist depth setting process, an exposing amount calculating process, a light transmission factor converting process, and a fine pattern creating process. Second through seventh aspects relate to a photomask designing method in connection with the first aspect.

Eighth through fourteenth aspects of the present invention relate to a photomask designing apparatus corresponding to the first through seventh aspects of the invention.

A fifteenth aspect of the present invention relates to a computer readable storage medium in which the stored program causes the computer to practice the resist depth setting process, the exposing amount calculating process, the light transmission factor converting process, and the fine pattern creating process. Sixteenth through twenty-first aspects relate to a computer readable storage medium in connection with the fifteenth aspect.

Twenty-second through twenty-fourth aspects relate to a photomask. Twenty-fifth aspect relates to a photoresist. Twenty-sixth aspect relates to a photosensitive resin. Twenty-seventh and twenty-eighth aspects relate to a base plate. A twenty-ninth aspect relates to a microlens. A thirtieth aspect relates to an optical element.

An embodiment of the present invention is described hereinafter, referring to the accompanying drawings FIGS. 1 through 13.

The embodiment relates to an example of a photomask designing apparatus. To state concretely, the photomask designing apparatus is a computer provided with a recording medium for recording a program of practicing the photomask designing process. Such a photomask designing apparatus practices the photomask designing method by practicing various sorts of processes based on the above-mentioned process program.

FIG. 1 is a block diagram illustrating the photomask designing apparatus. A computer serving as the photomask designing apparatus is provided with a CPU (Central Processing Unit) 1 for practicing various calculating processes and concentratedly controlling the respective sections. The computer has a structure in which a ROM 2 for storing fixed data and a RAM 3 for storing variable data are connected to the CPU 1 through a bus line, and further an input device 4 such as a keyboard, mouse, etc. and a hard disc 5 are also connected to the CPU 1 through the same bus line. An operating system OS, a processing program, a resist sensitivity curve 6 (refer to FIG. 2), and fine area data are stored in the hard disc 5. Furthermore, resist depth data are also stored in the same hard disc 5 in the process of designing the photomask. In that meaning, the hard disc 5 functions as the medium for storing the programs. A part in the data stored in the hard disc 5 is transferred into the RAM 3 and a high-speed processing is intended to accomplish. Moreover, the resist sensitivity curve 6 and the fine area data stored in the hard disc 5 and the resist depth data stored in the hard disc 5 in the process of the photomask are described later in detail.

Figure 3:
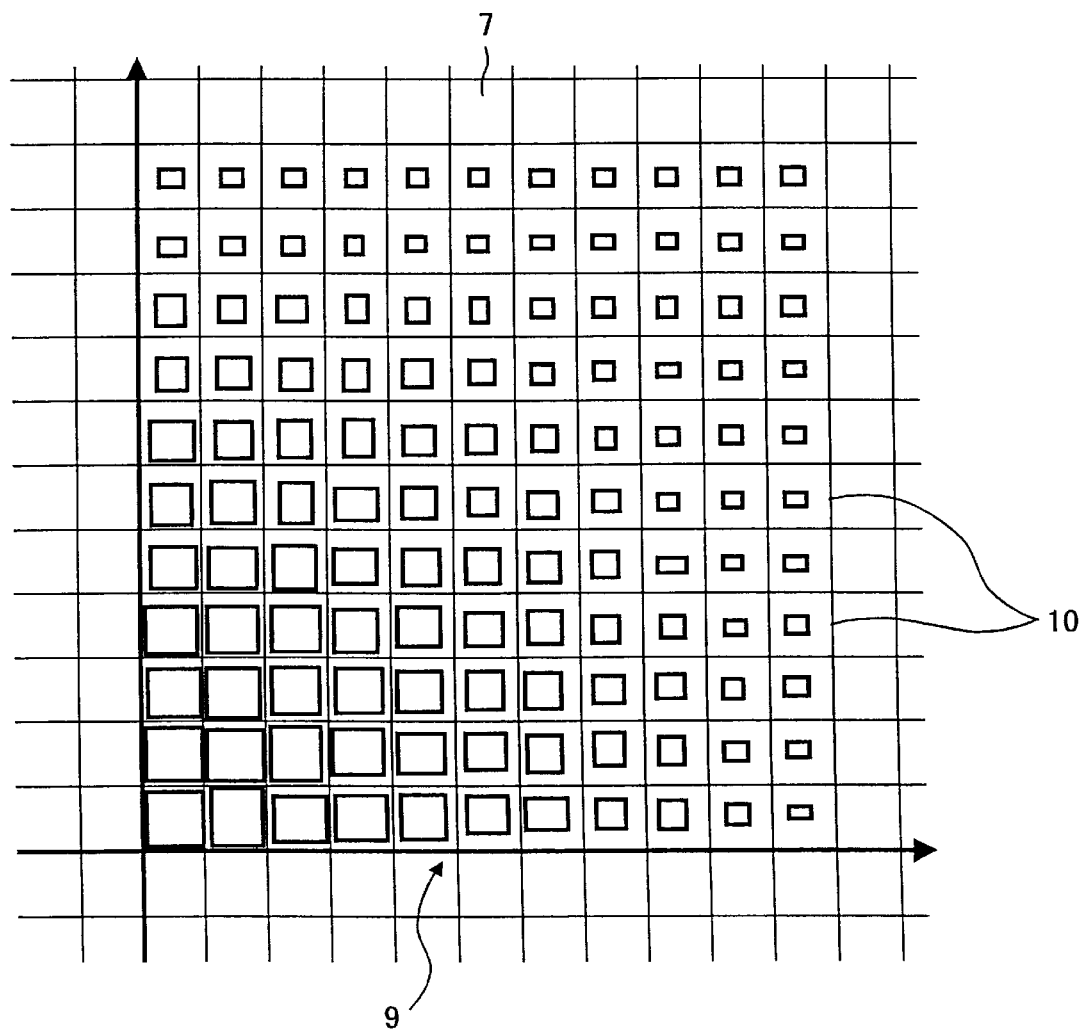
FIG. 3 a schematic diagram illustrating an example of a photomask.
Figure 4A:
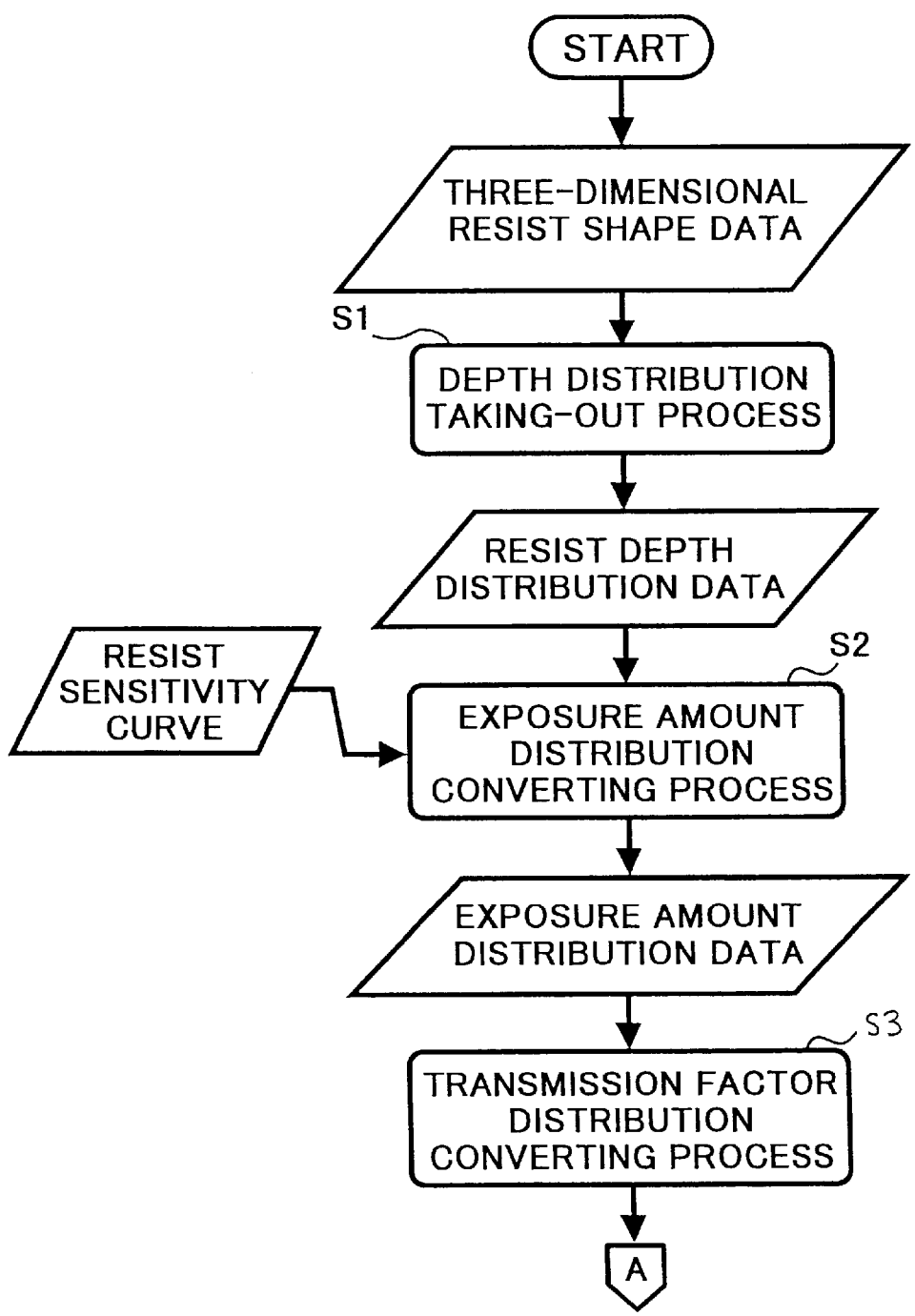
FIGS. 4A and 4B are a flow chart explaining the flow of a photomask designing process.
Figure 4B:
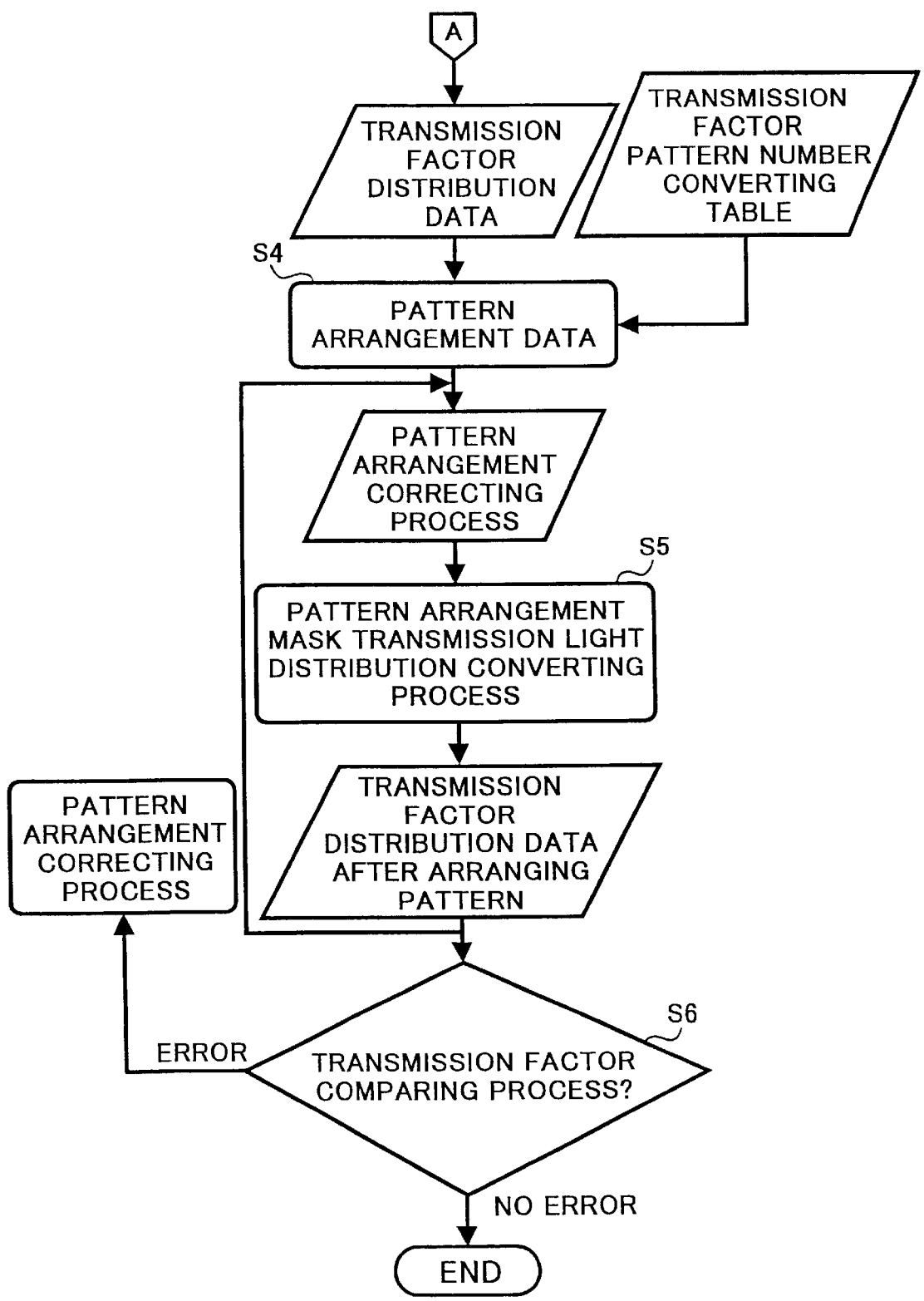
Figure 5:
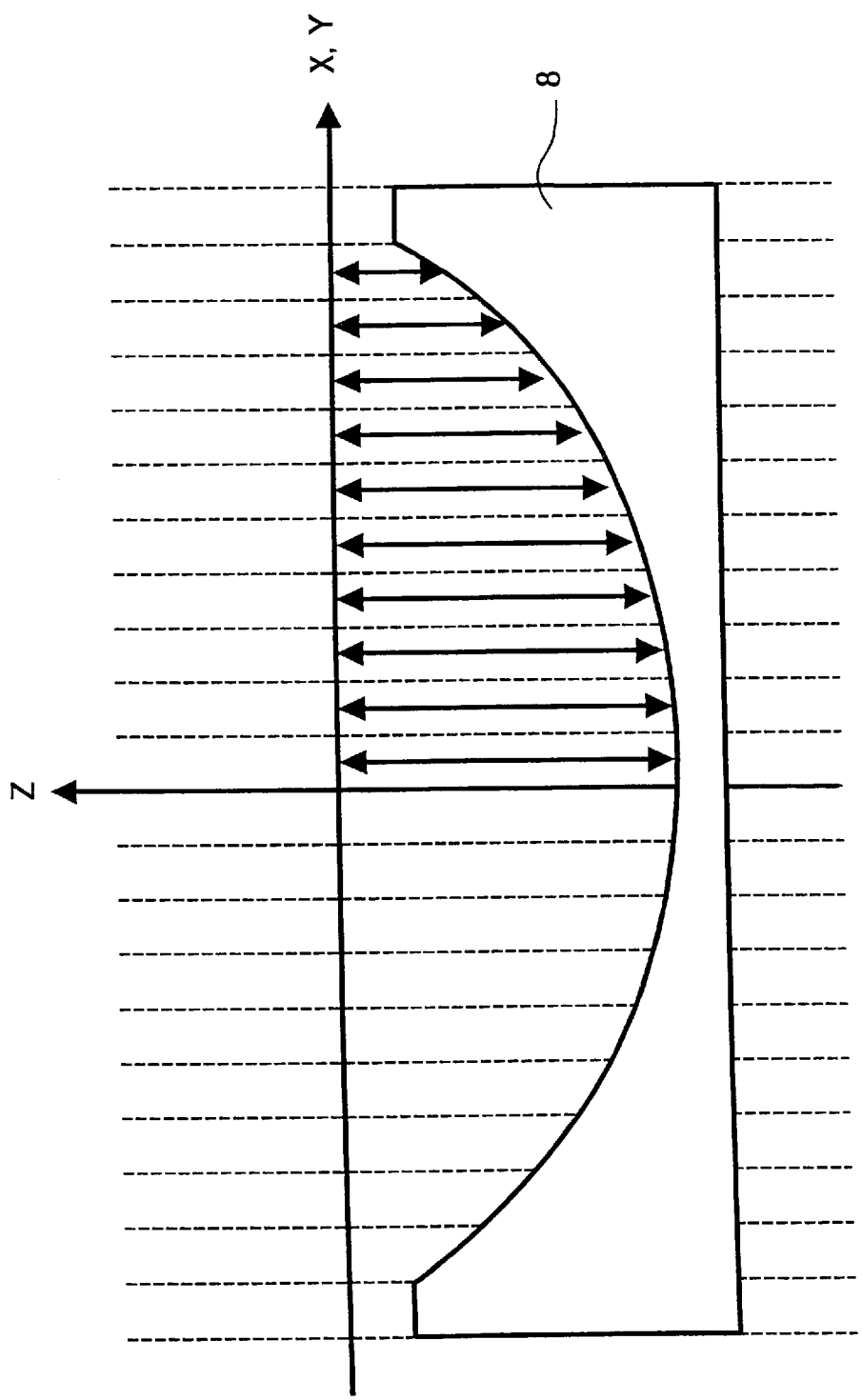
FIG. 5 is a schematic diagram illustrating an example of desired resist depth in respective fine areas for a photoresist.

Here, the photomask designed by the photomask designing apparatus of the embodiment according to the present invention can be used for manufacturing a microlens, see FIG. 3 and FIG. 5. Namely, a three-dimensional shaped resist pattern as a replica is formed on the photoresist 8 (FIG. 5) laminated on a base material (not shown) to be mechanically processed and the base material is treated with etching on the basis of the resist pattern, namely the base material is processed in the state of the same pattern as that of the resist pattern as the replica. In such a way, a microlens is formed. When such a microlens is manufactured, the photomask 7 (FIG. 3) is employed in order to control the depth of exposing the photoresist 8. Namely, the photomask 7 controls the intensity of the light radiated onto the photoresist 8 with the fine pattern 9. The fine pattern 9 is a gathering of fine areas 10 respectively having a predetermined light transmission factor.

In the present embodiment, the photomask 7 is designed by use of the photomask designing apparatus illustrated as an example in FIG. 1. An outline of the procedure thereof is as discussed below. At first, a resist sensitivity curve 6 showing the relationship between the exposing amount for the employed photoresist 8 and the depth of the resist is previously set, and the curve thus set is stored in the hard disc 5 (in the process of setting the resist sensitivity curve). The resist sensitivity curve 6 is, for instance, the curve illustrated as an example in FIG. 2. Furthermore, the fine area data corresponding to the plural light transmission factors of the predetermined halftone components is previously set and the data thus set is stored in the hard disc 5 (in the process of setting the fine area having a predetermined light transmission factor). To state concretely, the fine area data are data of the light transmission factor, i.e., a patterns number conversion table for storing the light transmission factor of a large number of fine areas having a certain value of the opening rate.

Next, on the basis of the target resist pattern, the resist depth formed on the designed photomask 7 is set in the resist depth setting process by use of the resist depth setting medium. And then, the exposing amount per each of the fine areas 10 corresponding to the target resist depth is set per each of the respective areas 10 and the resist sensitivity curve stored in the hard disc in the exposing amount calculating process by use of the exposing amount calculating medium. The exposing amount thus obtained per each of the fine areas is converted to a light transmission factor in the light transmission factor converting process by use of the light transmission factor converting medium.

Thereafter, the light transmission factor per each of the fine areas 10 is replaced by the fine area data stored in the hard disc 5 and the fine pattern 9 is created in the fine pattern creating process by use of the fine pattern creating medium.

In such a way, the photomask 7 provided with the desired fine pattern 9 can be designed. FIG. 3 is a schematic diagram for explaining an example of the photomask 7 thus designed.

In the designing and treatment of the photomask 7 as described heretofore in brief, the CPU 1 employs the fixed data stored in the ROM 2 or the RAM 3 as the work area in accordance with the process program stored in the hard disc 5 and practices various calculating processes. In such a way, the designing and the treatment of the photomask can be executed. The flow of the process practiced in accordance with such a process program is explained on the basis of the flow chart shown in FIG. 4.

(1) Resist depth Setting Process and Resist Depth Setting Medium.

At first, the operator inputs the three-dimensional resist form data through the input apparatus 4. The three-dimensional resist form data represents the resist depth (distance in the Z direction) per each of the respective fine areas 10 shown by the x and y coordinates for the photoresist 8. When the three-dimensional resist form data are input, the CPU 1 performs a process of taking out the distribution of the depth (Step S1), and thereby the value of the resist depth (distance in the direction) per each of the respective fine areas 10 on the photomask 7 to be designed which is represented by the x and y coordinates, that is, resist depth distribution data, are obtained. The resist depth distribution data thus obtained are temporarily stored in the work area of the RAM 3. Thereafter, the resist depth distribution data are stored in the hard disc 5. An example of the resist depth distribution data is shown in FIG. 6. The process of setting the resist depth is practiced per each of the fine areas 10 formed on the photomask to be designed.

Here, each fine area 10 on the photomask 7 to be designed has almost the same square measure as that of the fine area which is one unit of the fine area data previously stored in the hard discs. Each fine area 10 has, for instance, a square measure of 4 $\mu$m×4 $\mu$m. On this occasion, assuming that the unit length (address size) at the time of drawing the mask is 0.25 $\mu$m, a very small pattern of (4/0.25)×(4/0.258)=256 halftones for designing size. In the present embodiment, the square measure of the very small pattern is changed by 0.25 $\mu$m×0.25 $\mu$m×2 per one halftone. In such a way, the very small pattern of 100 halftones could be created.

There are plural values of the resist depth of the three-dimensional resist form data input from the input apparatus 4 in the fine area 10. When the respective data do not take a same value, it may be allowable to take out the center value or average value, etc. of the fine area 10 as the value of the fine area 10.

Figure 7:
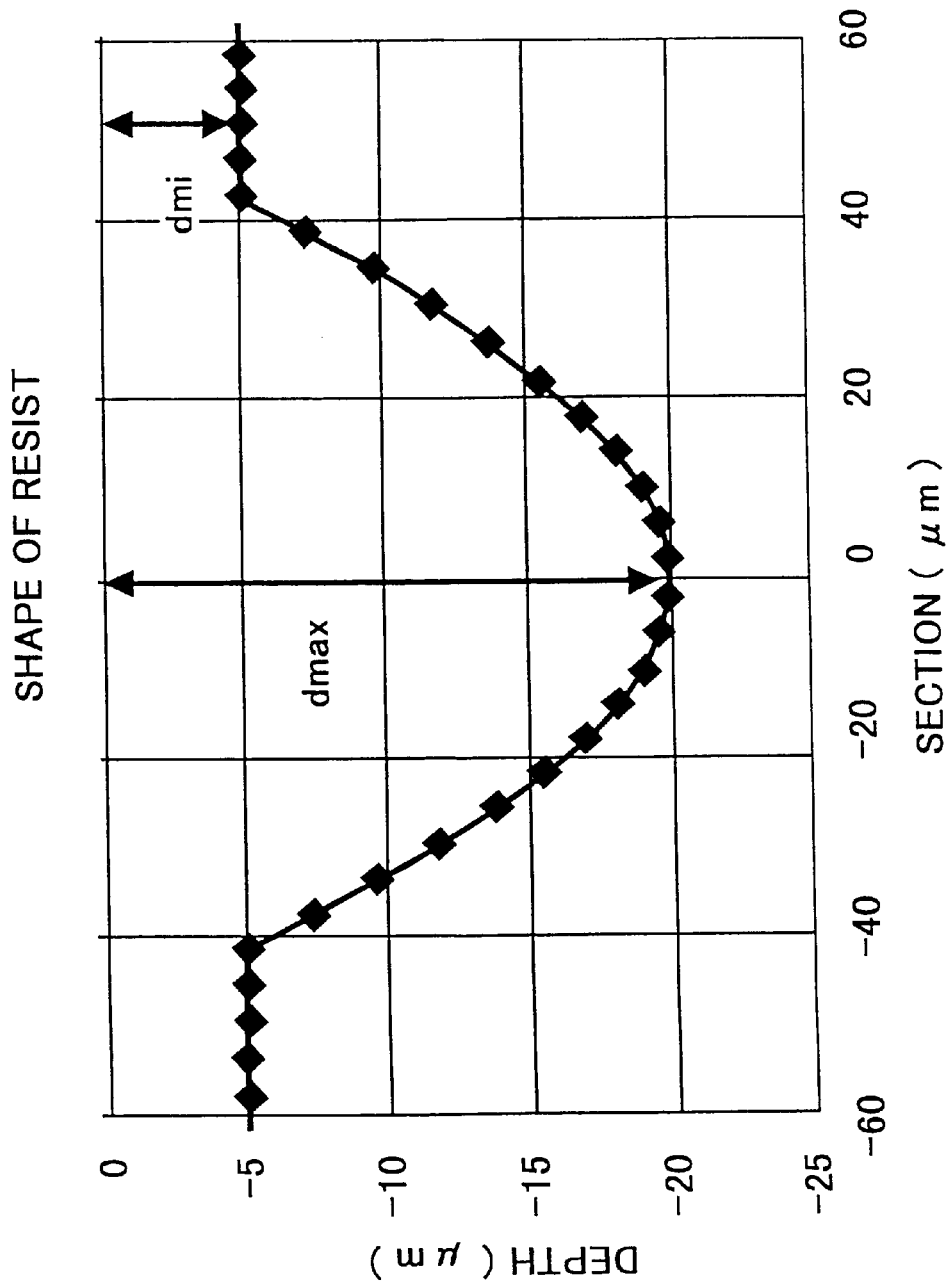
FIG. 7 is a graph showing resist depth based on resist depth distribution data.

Furthermore, regarding the resist form of the photoresist 8 as shown in FIG. 5, as further shown in the graph of FIG. 7 expressing the resist form in the graph, the maximum depth thereof (d max) is 20 $\mu$m and the minimum depth (d min) is 5 $\mu$m.

(2) Exposing Amount Calculating Process and Exposing Amount Calculating Medium.

Next, the CPU 1 performs an exposing amount distribution converting process of obtaining the exposing amount per each of the respective fine areas 10 corresponding to the target resist pattern on the basis of resist depth set per the fine area 10 and the resist sensitivity curve stored in the hard disc 5, and thereby the exposing amount distribution data can be obtained (Step S2).

Figure 2:
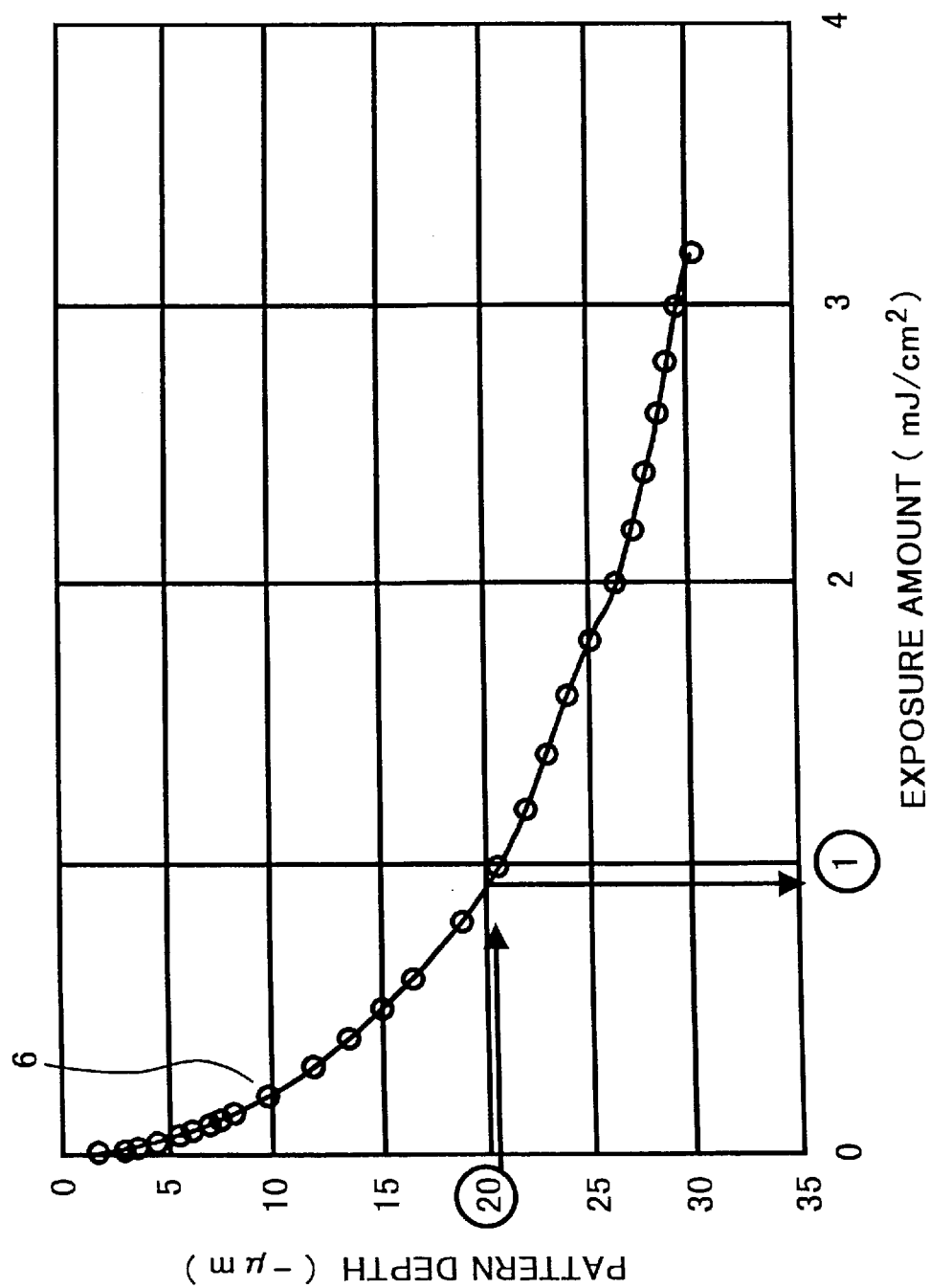
FIG. 2 is a graph showing a resist sensitivity curve.

Here, the resist sensitivity curve 6 stored in the hard disc 5 as shown in FIG. 2 is the resist sensitivity curve 6 of the photoresist 8 called OFPR 800-800cp (Tokyo Ohyo Kagaku Co., Ltd.). In this resist sensitivity curve 6, the pattern depth is measured until 31 μm. Here, as shown in FIG. 2, assuming that the resist depth set per each of the respective fine areas 10 is, for instance, 20 μm, the resist depth thus set is converted to the exposing amount of 0.95 mJ/cm² by use of the resist sensitivity curve 6. Such a process is performed for all of the respective fine areas 10, and thereby the exposing amount per each of the respective fine areas 10 can be obtained.

Figure 8:
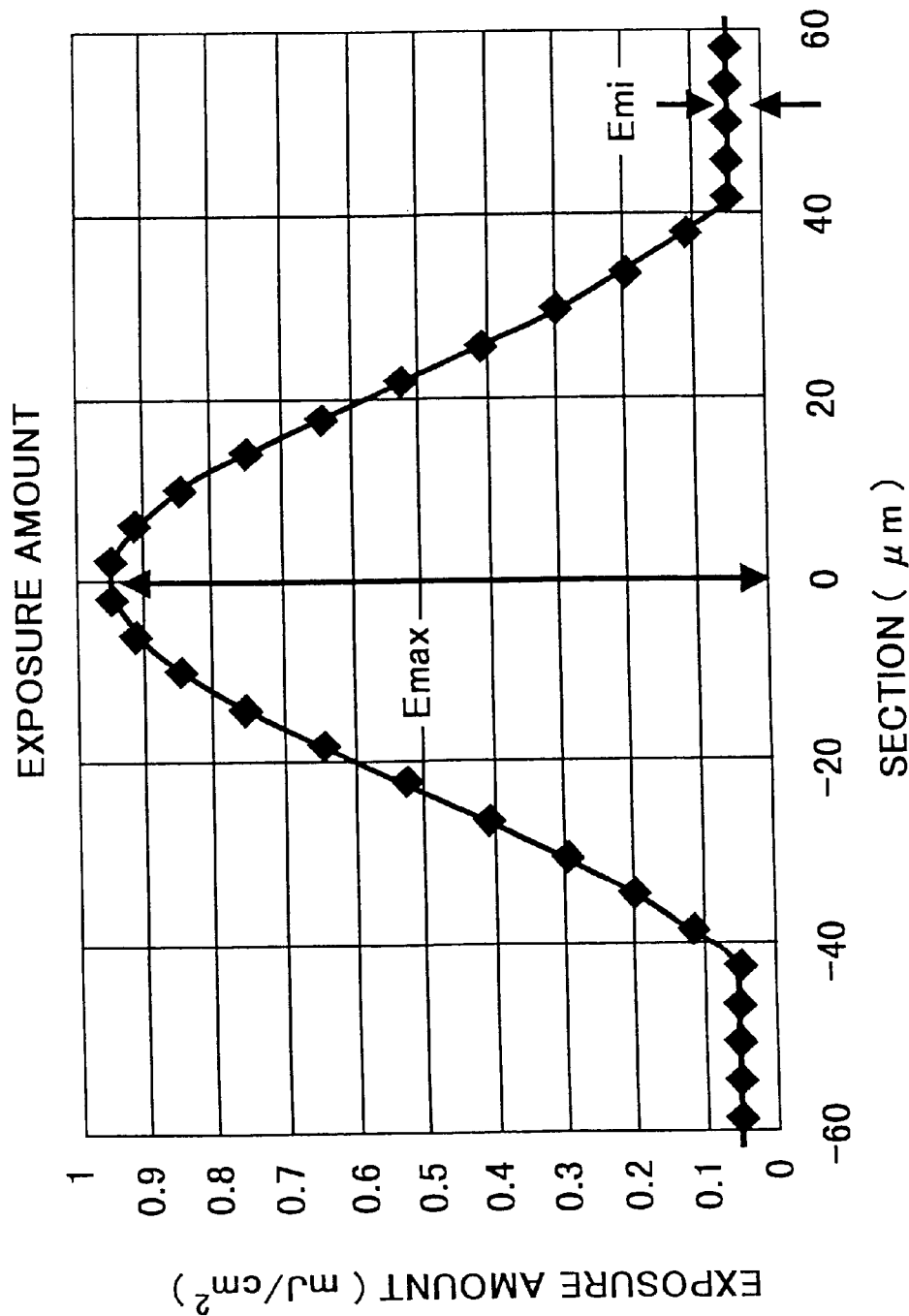
FIG. 8 is a graph showing resist depth converted to exposed light intensity.

In the case of utilizing the resist pattern of the photoresist 8 as shown in the present invention, the exposing amount distribution data can be obtained shown in the graph of FIG. 8. As shown in FIG. 8, the minimum value Emin and the maximum value Emax of the exposing amount are respectively the values as shown below;

$E\min=0.05 \text{ mJ/cm}^2$, and $E\max=0.95 \text{ mJ/cm}^2$.

(3) Light Transmission Factor Converting Process and Light Transmission Factor Converting Medium.

The CPU 1 practices a light transmission factor distribution conversion process of converting the exposing amount per each of the respective fine areas 10 to the light transmission factor in accordance with the process program (Step S3).

Figure 9:
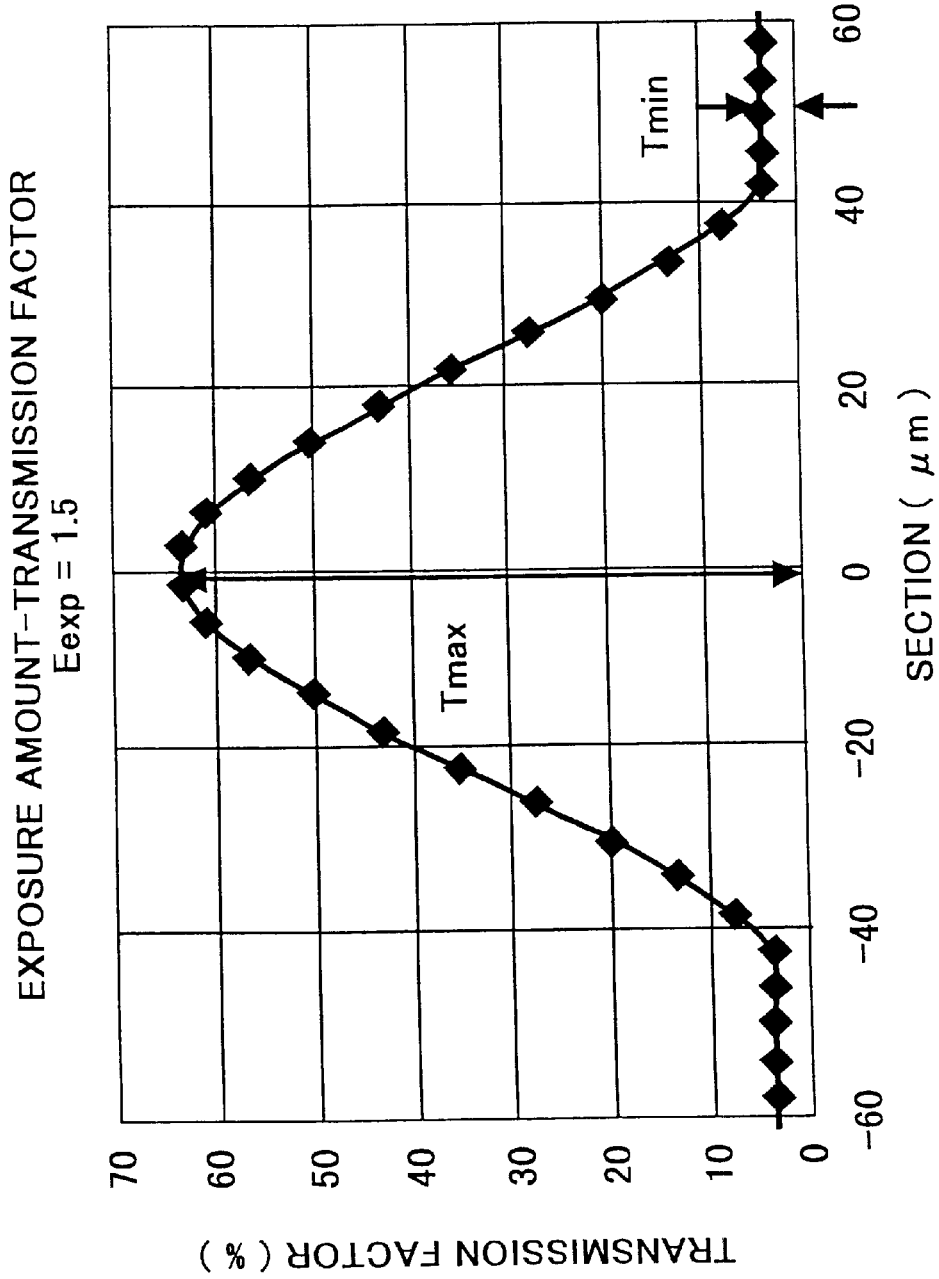
FIG. 9 is a graph showing exposed light intensity converted to a light transmission factor.

Namely, as the process of converting the light transmission factor distribution, the light transmission factor which can be practically realized on the photomask 7 is taken into consideration. The exposing amount Exep is determined for the portion of the light transmission factor of 100%. The exposing amount E obtained per each of the respective fine areas 10 is divided by the exposing amount Exep thus determined, and thereby the exposing amount E is converted to the light transmission factor T per each of the respective fine areas 10. In such a way, the exposing amount per each of the fine areas 10 as shown in the graph of FIG. 8 is converted to the light transmission factor per each of the fine areas 10 as shown in the graph of FIG. 9.

Regarding such a conversion process, when the value of Exep is determined, it is necessary to notice the extent of the light transmission factor which can be expressed on the photomask 7, the number of the halftones, and the variation amount of the resist depth per one halftone.

Figure 10:
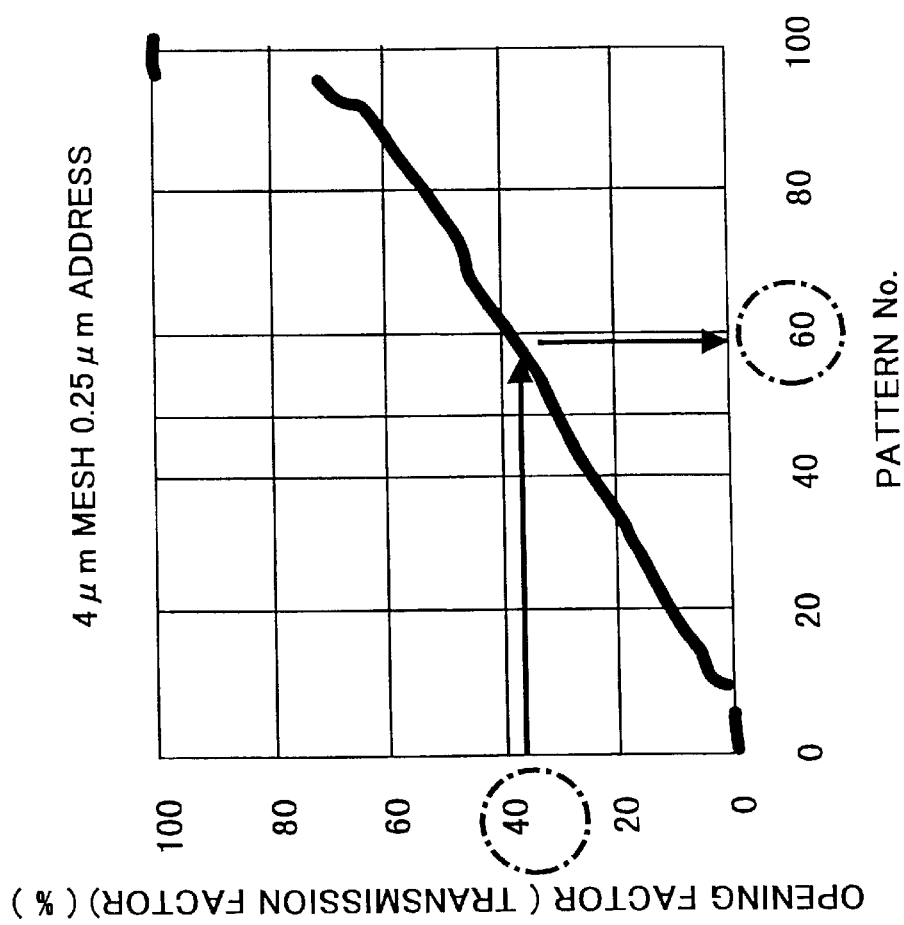
FIG. 10 is a graph showing practically measured values of a light transmission factor in fine areas.

Furthermore, FIG. 10 shows the extent of the light transmission factor which can be expressed on the photomask 7, the number of the halftones, and the variation amount of the resist depth per one halftone.

Furthermore, FIG. 10 shows the measured value of the light transmission factor (%) of the fine area 10 having the square measure of 4 μm×4 μm. Here, the pattern number is attached per each of the respective light transmission factors, and as mentioned before, the measurement has been attempted assuming the pattern having the almost 100 halftones changing by the step of 0.25 μm×0.25 μm×2. As a result, although the number of the halftones to be designed is 100, the light transmission factor which can be practically arranged on the photomask 7 is 2%–70%, and thereby the actual halftones number is 85 halftones. Therefore, if the maximum value of the light transmission factor which can be arranged on the photomask 7 is Tmax, it is necessary to satisfy the following equalities/inequalities:

$T\max=E\max/E\text{exp}\times100 \leq 70(\%)$ (1)

$T\min=E\min/E\text{exp}\times100 \geq 2(\%)$ (2)

It is possible to enlarge the range of such a light transmission factor by divising a method of drawing the mask pattern of the photomask 7 and the shape of the opening pattern, etc.

Next, as to the amount of the resist depth change per one halftone, it is necessary to make the amount equal to or less than the accuracy required for the resist pattern intended to be created. Namely, in the halftone pattern employed here, per one halftone, it is possible to change the light transmission factor of:

$0.25\times0.25\times2/4\times4\times100=0.78(\%)$ (3)

Here, in order to make the amount equal to or less than the accuracy required for the resist pattern intended to be created, if the shift of the created resist pattern is made within ±0.5 μm for the designed value, it is necessary to make the resist depth change within 1 μm in the case of changing the exposing amount by 0.78%. Here, regarding the resist sensitivity curve 6 of the photoresist 8 employed in the present embodiment, as shown in FIG. 2, the change of the resist depth becomes sharp in an area of a small exposing amount, and the greater the exposing amount, the less the resist changes. For this reason, the change of the resist depth per one halftone increases in an area of a small exposing amount, that is, an area of a low light transmission factor. Here, in the case of employing such a photoresist 8, since it is allowable to make the change of the resist depth per one halftone in the low light transmission factor less than 1 μm, assuming that the light transmission factor is Tmin in the lowest light transmission factor, that is, the smallest factor which can be applied to the fine area, and the resist depth for the exposing amount E is resist (E), the following condition is obtained:

$\text{resist}(T\min+0.75/100\times E\text{xep})-\text{resist}(T\min/100\times E\text{xep}) \leq 1 \ \mu m$ (4)

On this occasion, when the value of the left side of the inequality (4) does not become sufficiently small only by the adjustment of the exposing amount Exep, it is necessary to change Tmin. As is apparent from the resist sensitivity curve 6, in the area of a greater exposing amount, namely in the area of a higher light transmission factor, the greater the resist depth changes to the exposing amount. Therefore, at this time, the minimum depth of the resist pattern, that is, the minimum depth dmin of the resist form which is set in the resist depth setting process is increased, and thereby the value of Tmin is also increased. As a result, the value of the left side of the above inequality (4) can be decreased and thereby an area of mild (not sharp) inclination of the resist sensitivity curve 6 can be employed.

In other words, in the process of setting the resist depth, the pattern of the resist depth per each of the respective fine areas 10 is moved in order to further increase the minimum value of the set resist depth, and thereby the changing amount of the resist depth per one halftone can be set by use of the above-mentioned mild inclination of the resist sensitivity curve 6.

Furthermore, in order to raise the accuracy of the resist pattern formed on the photoresist 8, it is preferable to increase the number of the halftones. In order to increase the number thereof, for instance, the maximum size of the figure (maximum address size) which can be written in the photomask 7 can be made small, or the square measure of the fine area can be reduced.

As described heretofore, the exposing amount Exep is determined so as to satisfy the aforementioned equalities/inequalities (1), (2), and (3), and the exposing amounts E obtained by the respective fine areas 10 are divided by the determined exposing amount Exep. Thereby, the exposing amount E can be converted to the light transmission factor T per each of the respective fine areas 10. On this occasion, if the light transmission factor which can be successively changed on the photomask 7 can be arranged on the photomask 7, since the resist depth variation per one halftone does not need to be taken into consideration, it is sufficient to determine the exposing amount Exep so as to satisfy the aforementioned equalities/inequalities (1) and (2).

(4) Fine pattern Creating Process and Fine Pattern Creating Medium.

Next, the CPU 1 performs the pattern arrangement conversion treatment (Step S4) in accordance with the treatment program. Namely, the light transmission factor per each of the fine areas 10 is replaced by the fine area data stored in the hard disc 5, and then the fine pattern 9 is created. As mentioned before, the fine area data are the ones having the predetermined light transmission factor. To state concretely, the fine area data are the data of the light transmission factor—the pattern number conversion table which stores the light transmission factor of a large number of fine areas having an opening rate corresponding to the numbers of the patterns showing the respective fine areas. Namely, in the case of the present embodiment, the light transmission factor per each of the obtained fine areas 10 is replaced by the pattern number of the fine area having the same light transmission factor. On that occasion, since the light transmission factor takes the scattering value at the interval of 0.78%, the pattern number of the fine area having the light transmission factor nearest to that per each of the obtained fine areas 10 is selected. In such a way, the pattern arrangement data showing the arrangement of the pattern number can be obtained.

Needless to mention, since the one obtained pattern arrangement data is only the arrangement of the pattern number, in order to obtain the shape data of the photomask 7 from such pattern arrangement data, it is sufficient to develop the data of the fine areas corresponding to the respective pattern numbers from the fine areas data and replace the developed data by the CAD data. Thereby, the photomask provided with the desired fine pattern 9 can be designed.

In such a way, in the photomask designing apparatus of the present embodiment, the resist sensitivity curve 6 and the fine area data are previously set, and the photoresist depth set per each of the fine areas 10 is converted to the exposing amount by use of the resist sensitivity curve 6 and the exposing amount thus converted is further converted to the light transmission factor. The light transmission factor thus converted is replaced by the fine area data and the concrete fine pattern is created. Therefore, in a case that the depth of the desired photoresist pattern changes, the photomask can be designed by effectively utilizing the halftone number of the fine pattern which can be arranged on the photomask without any necessity of taking again the data. Even when the type of photomask is changed, since it is sufficient to change only the resist sensitivity curve, the photomask can be easily designed. Therefore, even in the photomask and its manufacturing method of enabling to make only the opening pattern of the scattering size as represented by the rectangular pattern writing-in with the step of the specified minimum size by use of the electronic beam picture drawing apparatus for the thin film such as the oxidized chrome film created by controlling the light transmission factor with the binary values of 0% and 100%, it turns out to be possible to utilize the photomask as the mask for creating the precise three-dimensional shape pattern.

(5) Compensation Treatment Process and Compensation Treatment Medium.

Theoretically, with the photomask designing method as mentioned above it is possible to obtain the photomask 7 having the fine pattern 9 capable of forming the desired photoresist 8 on a photoresist. On the other hand, in the case of employing such a photomask 7 in practice, there actually occurs a shift between the light intensity distribution after transmitting through the photomask 7 and the designed light intensity distribution due to the phenomenon of light diffraction, etc.

Here, in the photomask designing apparatus of the present embodiment, the compensation process is practiced by the processing of the CPU 1 in accordance with the process program. Namely, the conversion process from the pattern arrangement to the mask transmitted light distribution is practiced (Step S5). Thereby, the light intensity distribution of the light arriving onto the photoresist 8 after being transmitted through the created fine pattern 9 is calculated (a first compensation treatment process). As a result, the light transmission factor distribution data after arranging the pattern can be obtained. Regarding such a step, the step is performed in the following cases.

(1) In the case of employing the aligned, the gap between the photomask 7 and the photoresist 8 and the wavelength of the exposed light have to be taken into consideration.

(2) In the case of giving the distribution to the incident light angle to the photomask 7 by use of a vibration plate, etc., the distribution thereof has to be taken into consideration.

(3) In the case of employing the stepper, the parameters such as NA, coherence factor, focus offset, etc. have to be taken into consideration.

In the respective three cases (1)–(3) as mentioned above, the distribution of the light intensity practically directed onto the photoresist 8 as the incident light is calculated. The calculation result is expressed by the percentage of the incident light to the photomask 7. And then, the expressed calculation result can be directly compared with the light transmission factor distribution data before arranging the pattern.

Here, in the present embodiment, in order to simplify the calculation, the light intensity distribution is calculated by use of the function expressed in the following equality (5), in the first compensation treatment process:

$$int(x, y) = \int\int T(x+i, y+i)p(i,j)didj \quad (5)$$

Here, int(x, y), T(x, y), and p(i, j) respectively represent the following:

int(x, y) . . . light intensity on the coordinates x and y;

T (x, y) . . . light transmission factor on the position corresponding to x, y on the mask; and p(i, j) . . . dot image distribution function, that is, the function representing the spread on the photoresist of the light transmitted through a point on the mask.

On this occasion, the function of the dot image distribution representing the distribution of the light transmitted through the opening portion on the photomask 7 is approximated with the Gauss distribution, and the half-value width and the integration extent thereof are compared with the actual light transmission factor distribution and optimized.

Next, the light transmission factor comparing process is practiced, and the light transmission factor distribution data after arranging the pattern are compared with the same distribution data before arranging the pattern (Step S6). Namely, the light intensity per each of the fine areas 10 obtained by the calculation is compared and judged with the light intensity based on the light transmission factor converted in the process of the light transmission factor conversion (a second compensation treatment process).

As a result, when it is judged that an error occurs in the light intensity per each of the fine areas 10, the compensation treatment of the error pattern is practiced (Step S7, a third compensation treatment process).

Here, regarding the judgment standard of the error, the light transmission factor which can be arranged on the photomask 7 has to be taken into consideration, and if the deviation of the light transmission factor is larger than the half value of the variation value per one halftone, the deviation is judged to exist.

On this occasion, the data of the light transmission factor are replaced by the fine area data having the light transmission factor in the direction of canceling (off-setting) out the deviation. And then, after performing such a replacement treatment, the same treatment is repeated again and the same is further repeated until the deviation amount is converged. Consequently, the deviation between the light intensity distribution of the light after being transmitted through the photomask 7 and the light intensity distribution to be designed can be eliminated or reduced. In such a way, since the compensation treatment is repeated until the deviation amount is converged, the elimination or the reduction of the deviation can be executed with further high accuracy.

Moreover, according to the present embodiment, although the Gauss distribution is employed as the light intensity distribution after being transmitted through the photomask 7 in order to facilitate the calculation, if a function capable of precisely representing the light after being transmitted through the photomask 7 is employed, a pattern of further high precision can be arranged on the photomask 7. Furthermore, in a case that the simulation medium capable of estimating the information from the pattern of the photomask 7 to the shape of the photoresist 8 can be utilized, the resist pattern can be calculated from the opening pattern arrangement on the photomask 7, the target resist pattern can be calculated, the resist pattern can be compared with the resist pattern thus calculated, and a high-precision photomask 7 can be made by compensating for the deviation obtained by the above comparison.

Figure 11:
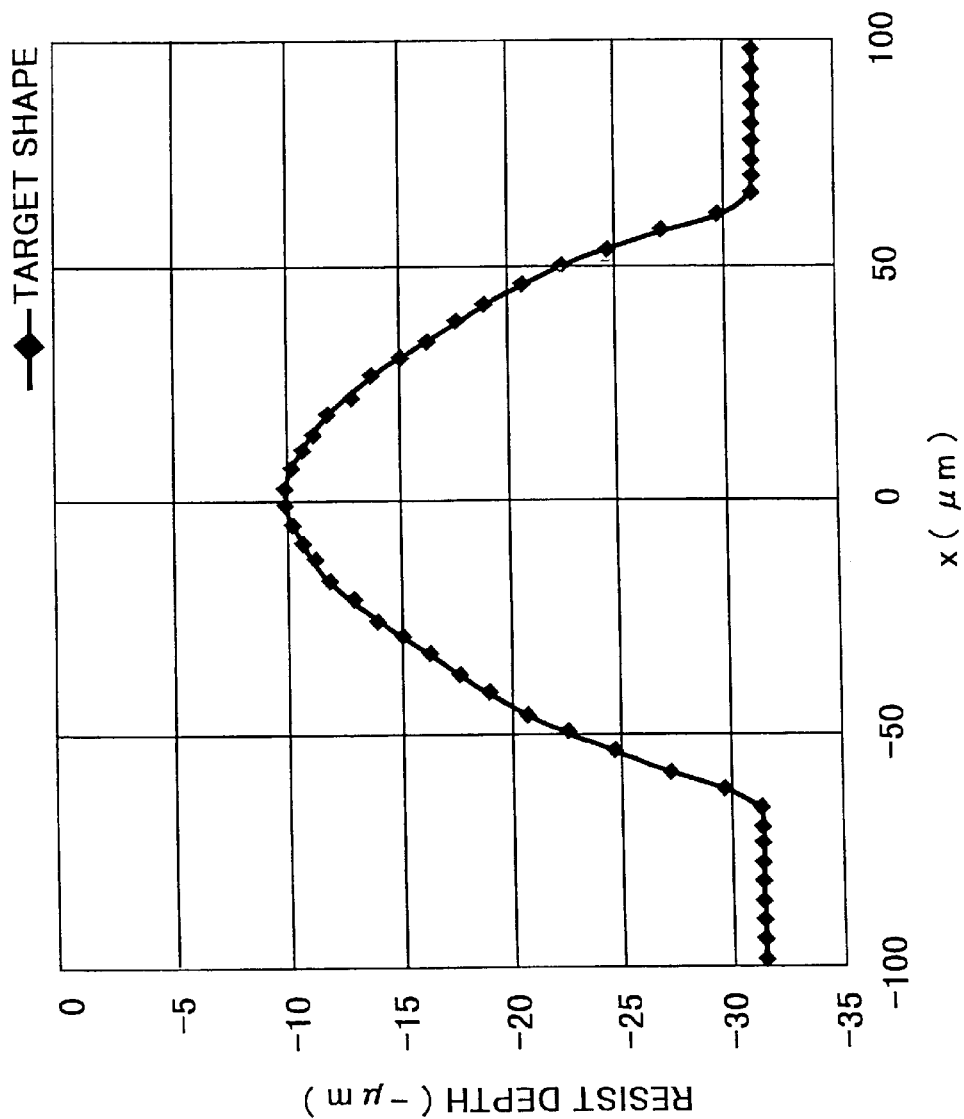
FIG. 11 is a graph showing resist depth of a target shape of a modification of the embodiment according to the present invention.

Here, in order to particularly explain the compensation treatment, it is assumed that the resist depth as shown in FIG. 11 is the target shape as in another different embodiment.

Figure 12:
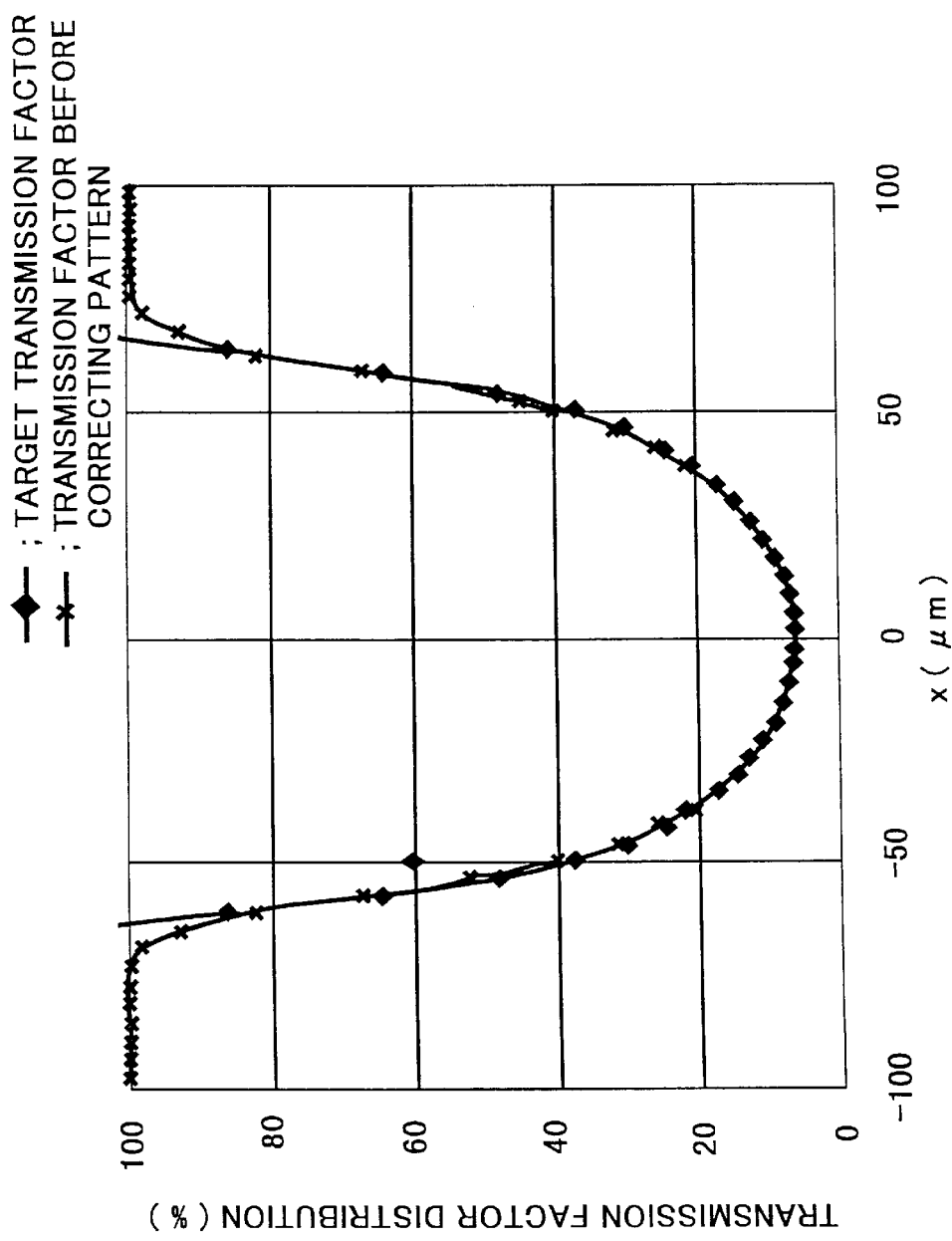
FIG. 12 is a graph showing a pre-compensation light transmission factor distribution and a target transmission faction distribution.
Figure 13:
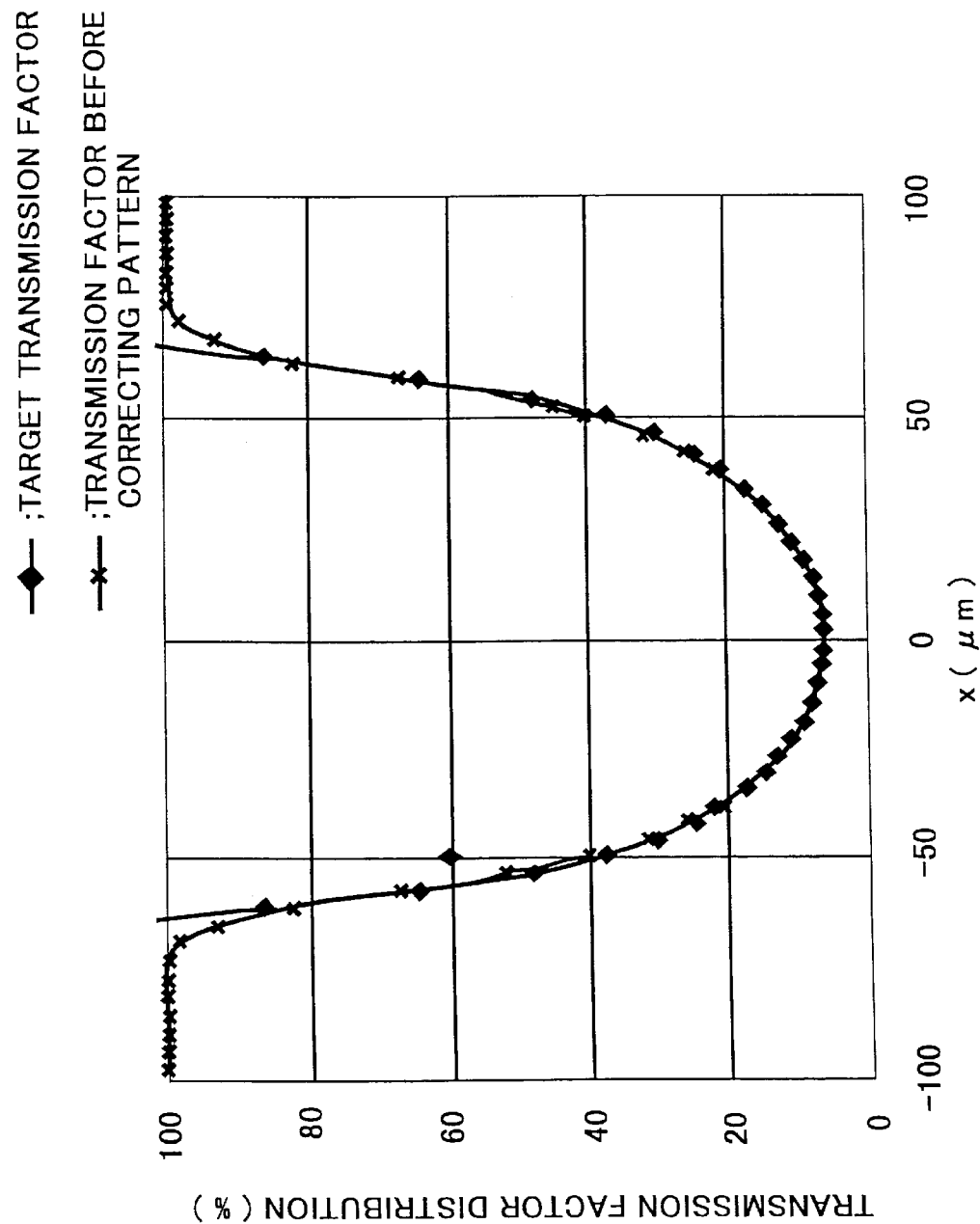
FIG. 13 is a graph showing a post-compensation light transmission factor distribution and a target transmission faction distribution.

FIG. 12 and FIG. 13 respectively show the light transmission factor distribution before and after the compensation and the target light transmission factor distribution. The area capable of being used as a lens is one having a radius of 60 μm. The amount of the deviation in the above area before the compensation is large, for instance 5% at maximum in the vicinity of ±50 where the variation rate of the light transmission factor. On the contrary, the amount of the deviation in the above area after the compensation is small, for instance 1% almost equal to one halftone of the resist pattern.

Next, an example of making a microlens by use of the photomask according to the present invention is explained, referring to FIGS. 14A through 14D which are process flow diagrams illustrating the process of making the microlens.

In the above example, in order to make a microlens by use of the photoresist 11, a method of transferring a microlens onto a base plate material utilizing the technology of anisotropic (acolotropic) etching can be employed. On that occasion, even though the photoresist 11 is replaced by the photosensitive resin, the microlens can be made with the same principle. Here, the method of making a microlens by use of the photoresist 11 is described. However, the description is jointly applicable to a method of making a microlens with photosensitive resin.

Figure 14A:
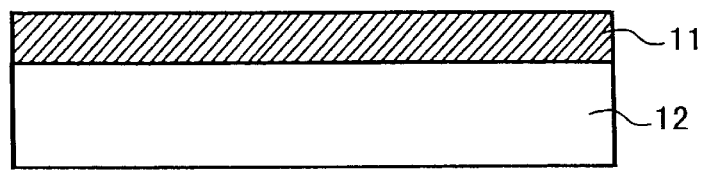
FIGS. 14A–14D are a process flow chart illustrating a process of making a microlens.

At first, as shown in FIG. 14A, the photoresist 11 of predetermined thickness is applied onto a base plate 12 composed of the material intended to make the microlens by use of a spin coater. The thickness of the photoresist 11 is made the same as the thickness assumed at the time of designing the mask. On this occasion, the thickness of the photoresist 11 can be adjusted by adjusting the viscosity of the photoresist 11 or by adjusting the revolution number of the spin coater. Thereafter, the applied photoresist 11 is dried by use of an oven, and then the photoresist 11 is cooled taking a sufficiently long time so as not to cause any cracks.

Figure 14B:
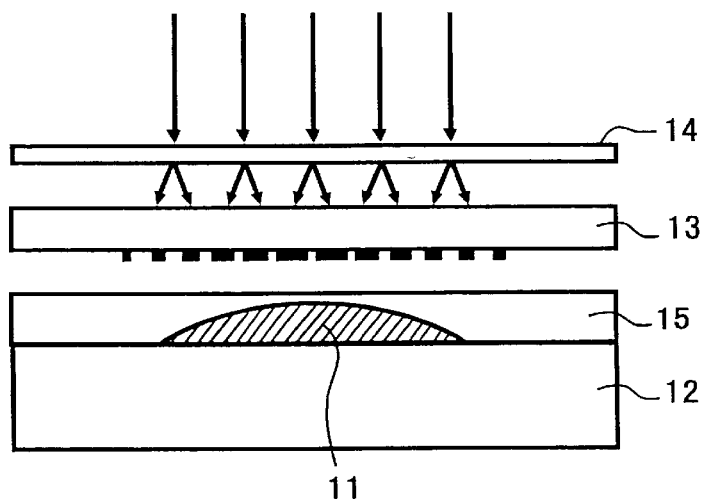

Next, as shown in FIG. 14B, the photoresist 11 is exposed by use of the photomask 13 including the microlens pattern. An aligner is used for the exposure. Regarding an arrangement of the respective parts employed at the time of the exposing process, as shown in FIG. 14B, a photomask 13 and a diffusion plate 14 are arranged on the photoresist 11 applied onto the base plate 12 and dried and cooled, and the light is radiated onto the photoresist 11 from a light source (not shown) through the diffusion plate 14 and the photomask 13. Here, the diffusion plate 14 has the functions of diffusing the light radiated from the light source and preventing the opening pattern formed on the photomask 13 from being transferred, as it is, to the photoresist 11.

Namely, the photomask 13 is arranged on the photoresist 11 at a predetermined interval. The diffusion plate 14 is arranged on the photomask 13 at a predetermined interval. Therefore, the light transmitted through the respective openings of the photomask 13 spreads out and propagates to the photoresist 11. Thereby, the opening pattern formed on the photomask 13 is prevented from being transferred, as it is, to the photoresist 11.

On this occasion, since the light transmitted through the respective openings spreads out and propagates to the photoresist 11, a deviation occurs between the pattern at the time of designing and the actual pattern. Therefore, such a deviation of the pattern is compensated for at the compensation process at the time of designing the photomask. In such a situation, it is necessary to cause the exposing amount of the photoresist 11 to coincide with the exposing amount assumed at the compensation process at the time of designing.

In such a way, the photomask 13 including the microlens pattern therein is employed and the exposing part 15 in the photoresist 11 is removed by the amount corresponding to the exposing amount. Thereby, the microlens pattern is created in the photoresist 11.

In the present embodiment, a method of employing an aligner is described. However, it is also possible to utilize a method of defocusing and putting out of focus by use of a stepper.

Figure 14C:
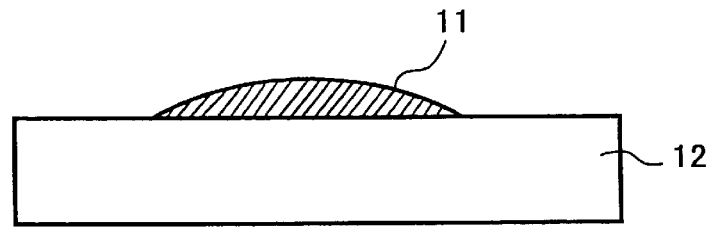

Thereafter, as shown in FIG. 14C, the development is performed and the photoresist pattern of the desired microlens shape is obtained. On this occasion, a sufficient transmission factor can be obtained with the employed wavelength. In a case that a photosensitive resin such as a photoresist or photosensitive polyimide, etc. durable for the used environment (temperature, humidity, etc.) is utilized, such resin can be used as a lens as it is.

Figure 14D:
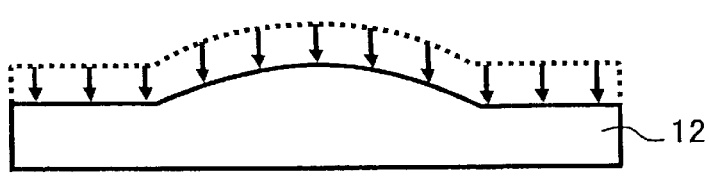

Finally, as shown in FIG. 14D, the photoresist pattern is transferred onto the base plate 12 utilizing anisotropy etching. In such a way, it is possible to obtain the desired microlens serving as an optical element.

Contrary to a background microlens, in the microlens made in such a way, it is possible to obtain a desired shape of the microlens such as a non-spherical shape or other shape as well as a spherical shape. Thereafter, a shape capable of reducing aberration, or a shape of inclining the optical axis by an optional angle, can be realized. In particular, in the case of reducing the aberration, it is possible to obtain a microlens capable of being used in requiring a fine light spot near the diffraction limit in the optical disc and a light probe microscope, etc.

Figure 15:
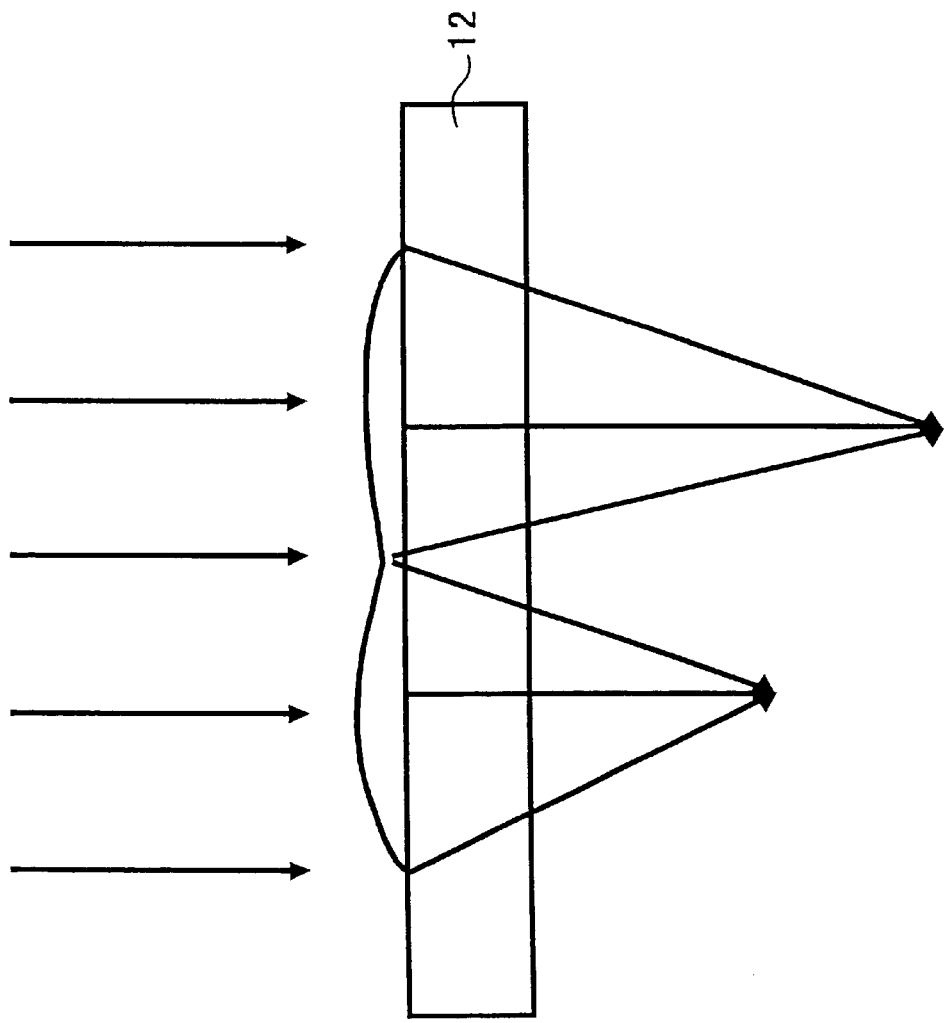
FIG. 15 is a side view showing an example of a microlens thus made with the process of FIG. 14.
Figure 16A:
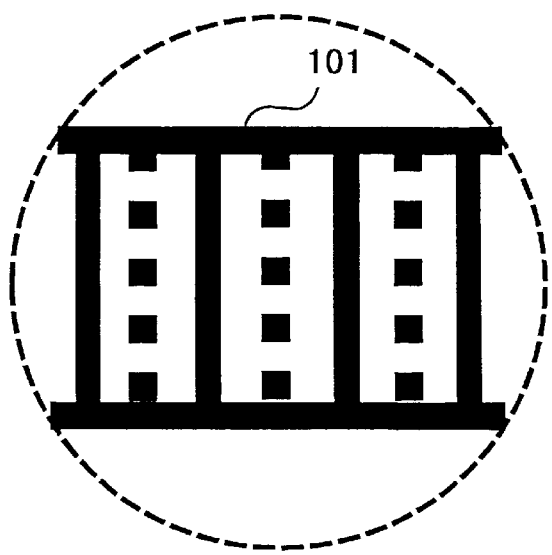
FIGS. 16A and 16B are a schematic diagrams illustrating an example of a resist pattern formed by use of a photomask.
Figure 16B:
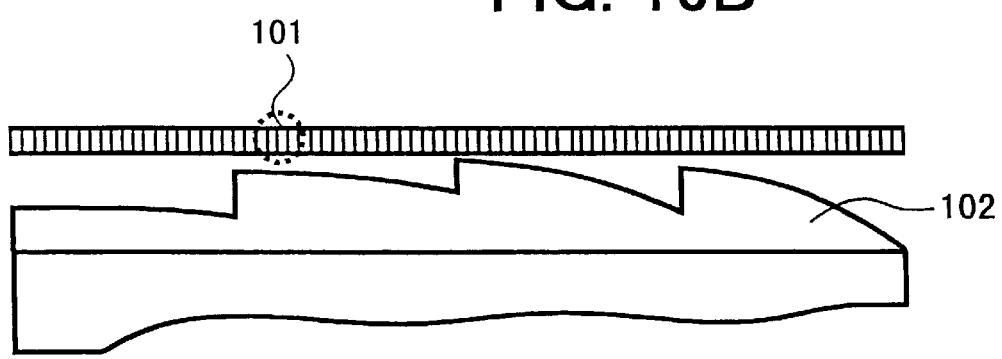
Figure 17B:
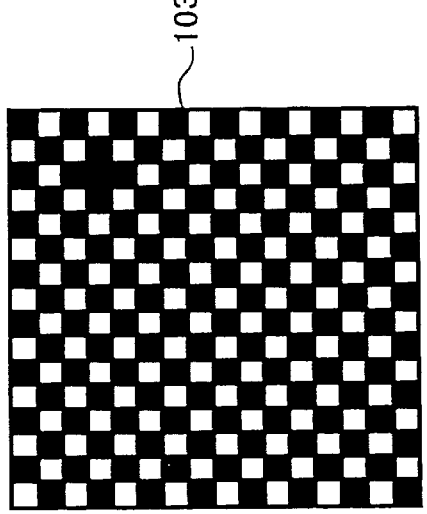
FIGS. 17A through 17D are schematic diagrams illustrating examples of a background-art photomask pattern.
Figure 17D:
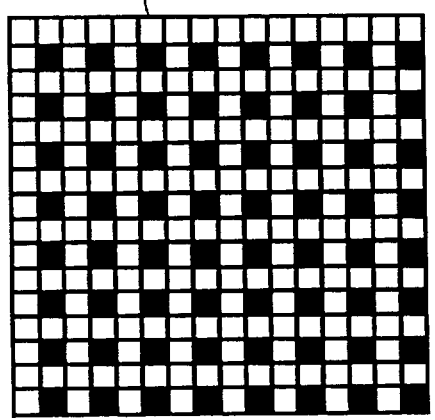
Figure 17A:
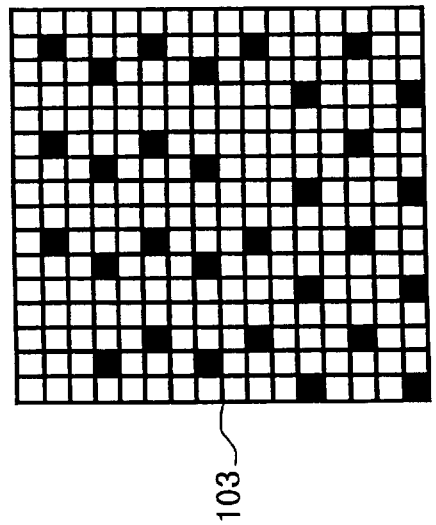
Figure 17C:
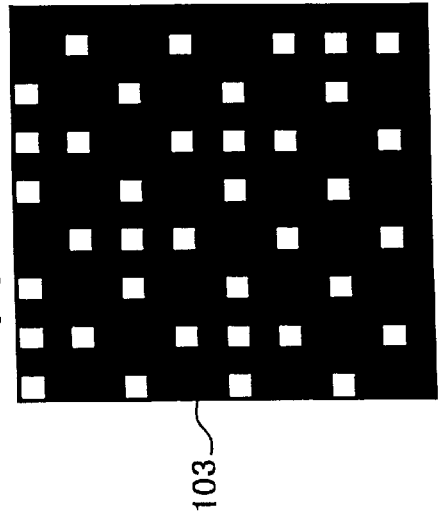
Figure 18:
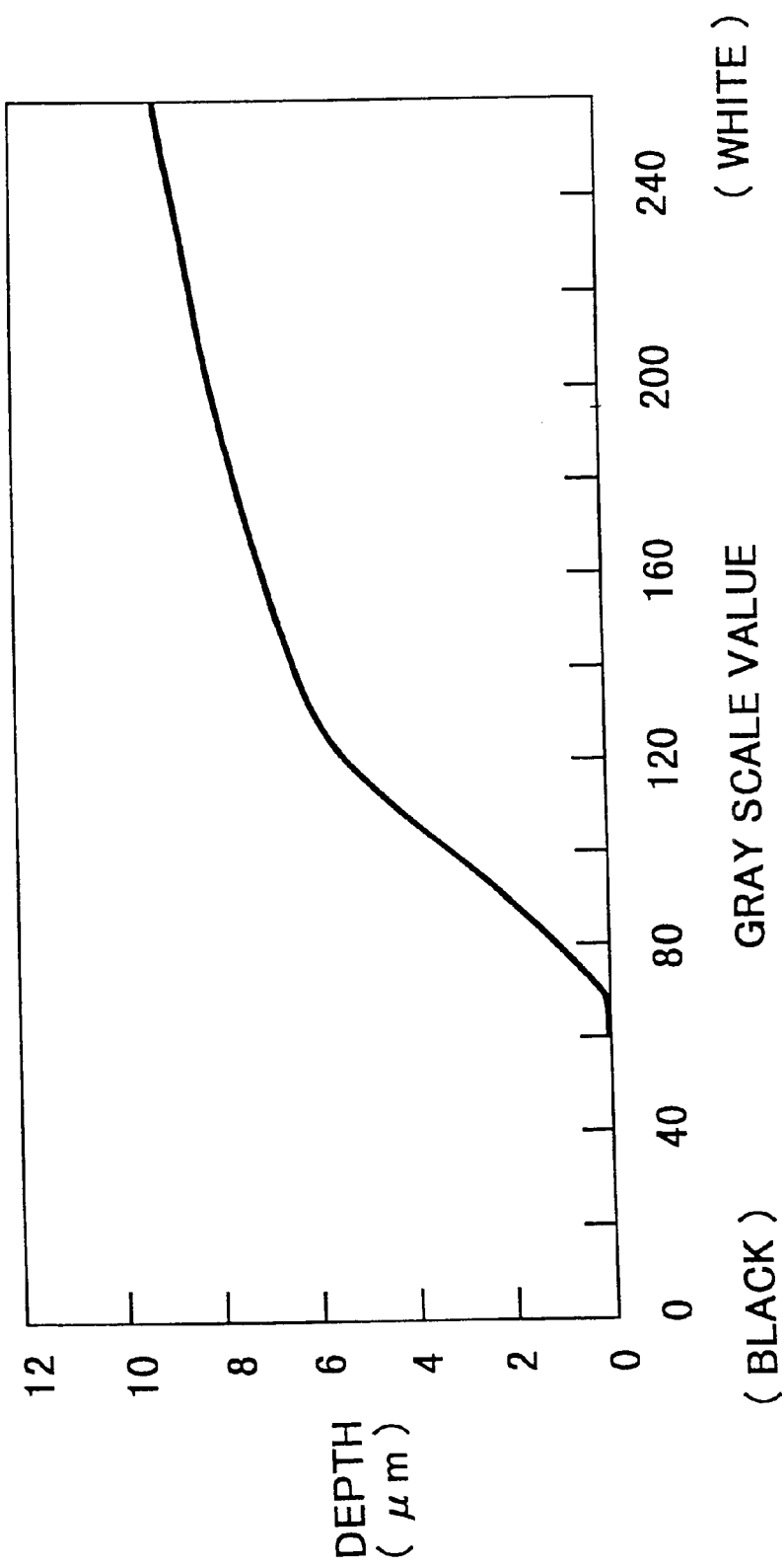
FIG. 18 is a graph showing a relationship between gray scale value and resist depth.

FIG. 15 is a side view illustrating an example of the microlens employed as a manufactured optical element. According to the method of making the microlens according to the present embodiment, the resist pattern is not thermally deformed, contrary to the background method of resist reflow. Therefore, it is possible to arrange a large number of lenses having equal diameter and different focal distances on a surface (refer to FIG. 15), or to form different optical parts such as a lens, prism, etc. as the same element at the same time. The above matter is a big merit of the present invention particularly for a flow method in which the pressure on the film of an applied photoresist has to be made different or the diameter of the lens has to be made different.

Heretofore, the embodiment of the present invention regarding the photomask designing method, the photomask designing apparatus, the computer readable storage medium, the photomask, the photoresist manufactured by use of the photomask, photosensitive resin, the base plate, the microlens, and the optical element has been described. The advantageous functional effects of the present invention have been described hereinafter for the respective aspects of the invention. A photomask designing method employed for respectively controlling the intensity of light radiated onto the photoresist with a fine pattern which is a congregation of a fine area having a predetermined light transmission factor and for forming a three-dimensional-shaped resist pattern corresponding to the fine pattern on the photoresist, includes steps of: a resist sensitivity curve setting process of previously setting a resist sensitivity curve showing the resist depth in relation to the light exposing amount for the employed photoresist; a fine area data setting process of previously setting the fine area data corresponding to plural light transmission factors of a predetermined halftone component; a resist depth setting process of setting the resist depth per each of the fine areas based on a target resist pattern; an exposing amount calculating process of obtaining the exposing amount per the fine area corresponding to the target resist pattern based on the resist depth set per the fine area and the resist sensitivity curve set in the resist sensitivity curve setting process; a light transmission factor converting process of converting the exposure amount per the fine area obtained by the exposing amount calculating process to the light transmission factor; and a fine pattern creating process of creating the fine pattern by replacing the light transmission factor per the fine area obtained in the light transmission factor converting process by the fine area data which is set in the fine area data setting process.

In such a structure, even though the depth of the desired photoresist pattern changes, the photomask can be designed by effectively utilizing the halftone number of the fine pattern which can be arranged on the photomask without requiring taking the data again. Furthermore, even in a case that the type of the photoresist changes, since it is sufficient to change only the resist sensitivity curve, the photomask can be easily designed.

In a second aspect of the invention in connection with the photomask designing method of the first aspect, in the light transmission factor converting process, assuming that the maximum value of the exposure amount obtained in the exposure amount calculating process is Emax, the minimum value thereof is Emin, the minimum value of the light transmission factor which can be given to the fine area is a, the maximum value thereof is b, the maximum value of the light transmission factor converted in the light transmission factor converting process is Tmax, and the minimum value thereof is Tmin, the value of Eexp is set such that Eexp satisfies the following equalities/inequalities:

$$T\min + \frac{E\min}{E\exp} \times 100 \geq a(\%),$$

and $$T\max = \frac{E\max}{E\exp} \times 10 \leq b(\%),$$

and the set value of Eexp is converted to the light transmission factor by dividing the exposure amount per each fine area by the value of Eexp. In such a method, the value of Exep is obtained and the exposing amount per each of the fine areas is divided by the value of Exep and converted to the light transmission factor, and thereby the light transmission factor of the part where the exposing amount becomes maximum in the resist pattern desired to be created and the light transmission factor of the other part where the exposing amount becomes minimum can be situated between the maximum value and the minimum value of the light transmission factor which can be arranged on the photomask. Consequently, the entire portion of the fine area which can be arranged on the photomask can be effectively utilized as the halftone number of the light transmission factor.

In a third aspect of the invention in connection with the photomask designing method of the second aspect, in the light transmission factor converting process, assuming that the light transmission factor which can be given to the fine area is T(n), wherein, n=1 . . . N, and T(n)<T(n+1), the resist depth for the exposure amount E is resist(E), and the accuracy required for the designed fine pattern is Δγ, the value of Eexp is set, Eexp satisfying the following inequality:

$$\left| resist\left(\frac{T(n)}{100} \times E\exp\right) - resist\left(\frac{T(n+1)}{100} \times E\exp\right) \right| \leq \Delta\gamma,$$

and the set value of Eexp is converted to the light transmission factor by dividing the exposure amount per each fine area by the value of Eexp. Consequently, the necessary accuracy can be secured to the fine pattern.

In a fourth aspect of the invention in connection with the photomask designing method of the first, second, and/or third aspects, in the resist depth setting process, the resist depth pattern per the fine area is moved such that the minimum value of the resist depth which is previously set increases.

In such a method, generally, the resist depth to the exposing amount sharply changes in the area of the small exposing amount, while the resist depth to the same becomes small in the area of the large exposing amount. Utilizing such a characteristic of the resist sensitivity curve showing the above-mentioned tendency, the area of small variation rate in the direction of the photoresist depth to the halftone number of the light transmission factor which can be given to the photomask can be employed. Thereby, the resolution to the halftone number of the light transmission factor can be enhanced.

In a fifth aspect of the invention in connection with the photomask designing method of the first, second, third and/or fourth aspects, the fine pattern creating process includes steps of: a first compensation treatment process of calculating the light intensity distribution arriving onto the photoresist after being transmitted through the created fine pattern; a second compensation treatment process of comparing the light intensity per the fine area obtained in the first compensation treatment process with the light intensity based on the light transmission factor converted in the light intensity factor converting process; and a third compensation treatment process of replacing the light intensity by the data of the fine area for decreasing the error when the error of the light intensity per the fine area is judged to occur in the second compensation treatment process.

In such a method, when the photomask is employed in practice, in consideration of the actual occurrence of the deviation between the intensity distribution of the light after the photomask transmission and the designed light intensity which is caused by the light diffraction phenomenon, etc., the deviation therebetween can be eliminated or decreased.

In a sixth aspect of the invention in connection with the photomask designing method of the fifth aspect, in the fine pattern creating process, the first, second, and third compensation treatment processes are repeated several times.

In such a method, the elimination or the reduction of the deviation between the light intensity distribution after the photomask transmission and the designed light intensity distribution can be performed with further high precision, by repeating several times the first, second, and third compensation treatment processes.

In a seventh aspect of the invention in connection with the photomask designing method of the fifth and/or sixth aspects, in the fine pattern creating process, the calculation of the light intensity distribution in the first compensation treatment process is performed by use of the following equation:

$$int(x, y) = \int\int T(x+i, y+j) p(i, j) di\, dj,$$

in which int(x, y) is the light intensity on the coordinates x and y, T(x, y) is the light transmission factor on the position corresponding to x, y on the mask, and p(i, j) is the dotted-line distribution function which is the function representing the spread on the photoresist of the light transmitted through a point on the mask. The light intensity distribution can be obtained by the calculation as mentioned above.

In an eighth aspect of the invention, a photomask designing apparatus employed for respectively controlling the intensity of the light radiated onto the photoresist with the fine pattern which is a congregation of the fine area having a predetermined light transmission factor and for forming the three-dimensional-shaped resist pattern corresponding to the fine pattern on the photoresist, includes storage for storing a resist sensitivity curve showing the resist depth in relation to the light exposing amount for the employed photoresist and fine area data corresponding to plural light transmission factors of the predetermined halftone component; a resist depth setting mechanism for setting the resist depth per each of the fine areas on the basis of a target resist pattern; an exposing amount calculator for obtaining the exposing amount per the fine area corresponding to the target resist pattern based on the resist depth set per the fine area and the resist sensitivity curve stored in the storage; a light transmission factor converter for converting the exposure amount per the fine area obtained by the exposing amount calculator means to the light transmission factor; and a fine pattern creator for creating the fine pattern by replacing the light transmission factor per the fine area obtained by the light transmission factor converter by the fine area data which is stored in the storage.

In such a structure, even though the depth of the desired photoresist pattern changes, the halftone number of the fine pattern capable of being arranged on the photomask is effectively utilized, and thereby the photomask can be designed without requiring taking the data again. Furthermore, even if the type of the photoresist changes, since it is sufficient to change only the resist sensitivity curve, the photomask can be easily designed.

In a ninth aspect of the invention in connection with the photomask designing apparatus of the eighth aspect, assuming that the maximum value of the exposure amount obtained in the exposure amount calculating process is Emax, the minimum value thereof is Emin, the minimum value of the light transmission factor which can be given to the fine area is a, the maximum value thereof is b, the maximum value of the light transmission factor converted in the light transmission factor converting process is Tmax, and the minimum value thereof is Tmin, the value of Eexp is set, Eexp satisfying the following inequalities:

$$T\min + \frac{E\min}{E\exp} \times 100 \geq a(\%),$$

and $$T\max = \frac{E\max}{E\exp} \times 10 \leq b(\%),$$

and the set value of Eexp is converted to the light transmission factor by dividing the exposure amount per each fine area by the value of Eexp.

In such a structure, in the equalities/inequalities the value of Exep is obtained and the exposing amount per each of the fine areas is divided by the obtained value of Exep and is converted to the light transmission factor, and thereby, the light transmission factor of the part at which the exposing amount becomes maximum in the resist pattern desired to be created and that of the part at which the same becomes minimum can be situated between the maximum value and the minimum value of the light transmission factor which can be arranged on the photomask. Consequently, the entire fine areas which can be arranged on the photomask can be effectively utilized as the halftone number of the light transmission factor.

In a tenth aspect of the invention in connection with the photomask designing apparatus of the ninth aspect, assuming that the light transmission factor which can be given to the fine area is T(n), wherein, n=1 ... N, and T(n)<T(n+1), the resist depth for the exposure amount E is resist(E), and the accuracy required for the designed fine pattern is Δγ, the value of Eexp is set, Eexp satisfying the following inequality:

$$\left| resist\left(\frac{T(n)}{100} \times E\exp\right) - resist\left(\frac{T(n+1)}{100} \times E\exp\right) \right| \leq \Delta\gamma,$$

and the set value of Eexp is converted to the light transmission factor by dividing the exposure amount per each fine area by the value of Eexp. By performing the calculation and conversion in accordance with the above inequality, the accuracy required for the fine pattern can be secured.

In an eleventh aspect of the invention in connection with the photomask designing apparatus of the eighth, ninth, and/or tenth aspects, the resist depth setting device moves the resist depth pattern per the fine area such that the minimum value of the resist depth which is previously set increases.

In such a structure, generally, the resist depth to the exposing amount sharply changes in an area of small exposing amount, while the resist depth to the same becomes small in an area of large exposing amount. Utilizing such a characteristic of the resist sensitivity curve showing the above-mentioned tendency, the area of small variation rate in the direction of the photoresist depth to the halftone number of the light transmission factor which can be given to the photomask can be employed. Thereby, the resolution to the halftone number of the light transmission factor can be enhanced.

In a twelfth aspect of the invention in connection with the photomask designing apparatus of the eighth, ninth, tenth, and/or eleventh aspects, the photomask designing apparatus includes a first compensation treatment mechanism for calculating the light intensity distribution arriving onto the photoresist after being transmitted through the created fine pattern; a second compensation treatment mechanism for comparing the light intensity per the fine area obtained in the first compensation treatment mechanism with the light intensity based on the light transmission factor converted in the light intensity factor converting process; and a third compensation treatment mechanism for replacing the light intensity by the data of the fine area for decreasing the error when the error of the light intensity per the fine area is judged to occur in the second compensation treatment mechanism.

In such a structure, when the photomask is employed in practice, in consideration of the actual occurrence of the deviation between the intensity distribution of the light after the photomask transmission and the designed light intensity which is caused by the light diffraction phenomenon, etc., the deviation therebetween can be eliminated or decreased.

In a thirteenth aspect of the invention in connection with the photomask designing apparatus of the thirteenth aspect, the fine pattern creater repeats several times the compensation treatment processes by the first, second, and third compensation treatment mechanism.

In such a structure, the elimination or the reduction of the deviation between the light intensity distribution after the photomask transmission and the designed light intensity distribution can be performed with further high precision, by repeating several times the first, second, and third compensation treatment processes.

In a fourteenth aspect of the invention in connection with the photomask designing apparatus of the twelfth and/or thirteenth aspects, the fine pattern creater performs the calculation of the light intensity distribution in the first compensation treatment mechanism by use of the following equation:

$$int(x, y) = \iint T(x+i, y+j) p(i, j) di\, dj,$$

in which int(x, y) is the light intensity on the coordinates x and y, T(x, y) is the light transmission factor on the position corresponding to x, y on the mask, and p(i, j) is the dotted-line distribution function which is the function representing the spread on the photoresist of the light transmitted through a point on the mask. The light intensity distribution can be obtained by the calculation as mentioned above.

In a fifteenth aspect of the invention in connection with a computer readable storage medium, a storage medium is installed in a computer practicing the photomask designing process employed for controlling the intensity of the light radiated onto the photoresist with the fine pattern which is a congregation of the fine area having a predetermined light transmission factor and for forming the three-dimensional-shaped resist pattern corresponding to the fine pattern on the photoresist. A program stored in the computer readable storage medium causes the computer to practice a resist depth setting process of setting the resist depth per each of the fine areas on the basis of a target resist pattern; an exposing amount calculating process of obtaining the exposing amount per the fine area corresponding to the target resist pattern based on the resist depth set per the fine area and the resist sensitivity curve showing the resist depth for the photoresist exposing amount previously stored in a storage; a light transmission factor converting process of converting the exposure amount per the fine area obtained by the exposing amount calculating process to the light transmission factor; and a fine pattern creating process of creating the fine pattern by replacing the light transmission factor per the fine area obtained in the light transmission factor converting process by the fine area data caused to correspond to plural light transmission factors of predetermined halftone component previously stored in the storage.

In such a structure, even though the depth of the desired photoresist pattern changes, the photomask can be designed by effectively utilizing the halftone number of the fine pattern which can be arranged on the photomask without requiring to take the data again. Furthermore, even in a case that the type of the photoresist changes, since it is sufficient to change only the resist sensitivity curve, the photomask can be easily designed.

In a sixteenth aspect of the invention in connection with the computer readable storage medium of the fifteenth aspect, in the light transmission factor converting process, assuming that the maximum value of the exposure amount obtained in the exposure amount calculating process is Emax, the minimum value thereof is Emin, the minimum value of the light transmission factor which can be given to the fine area is a, the maximum value thereof is b, the maximum value of the light transmission factor converted in the light transmission factor converting process is Tmax, and the minimum value thereof is Tmin, the value of Eexp is set, Eexp satisfying the following inequalities:

$$T\min + \frac{E\min}{E\exp} \times 100 \geq a(\%),$$

and $$T\max = \frac{E\max}{E\exp} \times 10 \leq b(\%),$$

and the set value of Eexp is converted to the light transmission factor by dividing the exposure amount per each fine area by the value of Eexp.

In such a method, the value of Exep is obtained and the exposing amount per each of the fine areas is divided by the value of Exep and converted to the light transmission factor, and thereby the light transmission factor of the part at which the exposing amount becomes maximum in the resist pattern desired to be created and the light transmission factor of the other part at which the exposing amount becomes minimum can be situated between the maximum value and the minimum value of the light transmission factor which can be arranged on the photomask. Consequently, the entire portion of the fine area which can be arranged on the photomask can be effectively utilized as the halftone number of the light transmission factor.

In a seventeenth aspect of the invention in connection with the computer readable storage medium of the sixteenth aspect, in the light transmission factor converting process, assuming that the light transmission factor which can be given to the fine area is T(n)[wherein, n=1 . . . N, and T(n)<T(n+1)], the resist depth for the exposure amount E is resist(E), and the accuracy required for the designed fine pattern is Δγ, the value of Eexp is set, Eexp satisfying the following inequality:

$$\left| resist\left(\frac{T(n)}{100} \times Eexp\right) - resist\left(\frac{T(n+1)}{100} \times Eexp\right) \right| \leq \Delta\gamma,$$

and the set value of Eexp is converted to the light transmission factor by dividing the exposure amount per each fine area by the value of Eexp. Consequently, the necessary accuracy can be secured to the fine pattern.

In an eighteenth aspect of the invention in connection with the computer readable storage medium of the fifteenth, sixteenth, and/or seventeenth aspects, the resist depth setting process, the resist depth pattern per the fine area is moved such that the minimum value of the resist depth which is previously set increases.

In such a method, generally, the resist depth to the exposing amount sharply changes in the area of the small exposing amount, while the resist depth to the same becomes small in the area of the large exposing amount. Utilizing such a characteristic of the resist sensitivity curve showing the above-mentioned tendency, the area of small variation rate in the direction of the photoresist depth to the halftone number of the light transmission factor which can be given to the photomask can be employed. Thereby, the resolution to the halftone number of the light transmission factor can be enhanced.

In a nineteenth aspect of the invention in connection with the computer readable storage medium of the fifteenth, sixteenth, seventeenth, and/or eighteenth aspects, the fine pattern creating process includes steps of: a first compensation treatment process of calculating the light intensity distribution arriving onto the photoresist after being transmitted through the created fine pattern; a second compensation treatment process of comparing the light intensity per the fine area obtained in the first compensation treatment process with the light intensity based on the light transmission factor converted in the light intensity factor converting process; and a third compensation treatment process of replacing the light intensity by the data of the fine area for decreasing the error when the error of the light intensity per the fine area is judged to occur in the second compensation treatment process.

In such a method, when the photomask is employed in practice, in consideration of the actual occurrence of the deviation between the intensity distribution of the light after the photomask transmission and the designed light intensity which is caused by the light diffraction phenomenon, etc., the deviation therebetween can be eliminated or decreased.

In a twentieth aspect of the invention in connection with the computer readable storage medium of the nineteenth aspect, in the fine pattern creating process, the first, second, and third compensation treatment processes are repeated several times.

In such a method, the elimination or the reduction of the deviation between the light intensity distribution after the photomask transmission and the designed light intensity distribution can be performed by repeating several times the first, second, and third compensation treatment processes.

In the twenty-first aspect of the invention in connection with the computer readable storage medium of the nineteenth and/or twentieth aspects, in the fine pattern creating means performs the calculation of the light intensity distribution in the first compensation treatment process by use of the following equation:

$$int(x, y) = \int\int T(x+i, y+j) p(i, j)\, di\, dj,$$

in which int(x, y) is the light intensity on the coordinates x and y, T(x, y) is the light transmission factor on the position corresponding to x, y on the mask, and p(i, j) is the dotted-line distribution function which is the function representing the spread on the photoresist of the light transmitted through a point on the mask. The light intensity distribution can be obtained by the calculation as mentioned above.

A photomask of the twenty-second aspect of the invention is designed by use of the photomask designing method as defined in any one of the first through seventh aspects. Therefore, the photomask can be easily designed by the method of those aspects. Furthermore, the photomask can be designed with further high accuracy by use of the generally-used calculation apparatus.

In a twenty-third aspect of the invention in connection with the photomask of the twenty-second aspect, the light transmission factor changes scatteringly. Therefore, a writing-in technology such as a technology of scatteringly writing the mask pattern with an electronic beam or laser for use in the manufacturing of the semiconductor can be utilized as it is. Consequently, the fine pattern can be easily and precisely created and the easy manufacturing thereof can be intended.

In a twenty-fourth aspect of the invention in connection with the photomask of the twenty-third aspect, the photomask is made of a material which changes binarily between 100 percent and 0 percent; and wherein the light transmission factor is changed by changing the size of the opening portion disposed on the fine area. Therefore, a writing-in technology such as a technology of scatteringly writing the mask pattern with an electronic beam or laser for use in the manufacturing of the semiconductor can be utilized as it is. Consequently, the fine pattern can be easily and precisely created and the easy manufacturing thereof can be intended. Moreover, a generally-used substance can be employed as the material of the photomask.

In a twenty-fifth aspect of the invention, since the photoresist is exposed by use of the photomask of the twenty-second, twenty-third, and/or twenty-fourth aspects, the photoresist can be utilized as optical parts in a wavelength area of the light transmitted through the photoresist. Furthermore, the photoresist can be easily made in a desired shape such as a non-spherical surface, etc., as well as a spherical surface.

In a twenty-sixth aspect of the invention, since the photosensitive resin is exposed by use of the photomask of the twenty-second, twenty-third, and/or twenty-fourth aspects, the photosensitive resin can be utilized as an optical parts in the wavelength area of the light transmitted through the photosensitive resin. Furthermore, the photosensitive resin can be easily made in a desired shape such as a non-spherical surface, etc., as well as a spherical surface.

In a twenty-seventh aspect of the invention, since the photoresist of the twenty-fifth aspect is transferred, utilizing the method of anisotropy dry-etching, to the base plate, the base plate can be utilized as optical parts in the wavelength area of the light transmitted through the base board material. Furthermore, the base plate can be easily made in a desired shape such as a non-spherical surface, etc., as well as a spherical surface.

In a twenty-eighth aspect of the invention, since the photosensitive resin pattern of the twenty-sixth aspect is transferred, utilizing the same method of the anisotropy dry-etching, to the photosensitive resin pattern, the same functional effect as that of the twenty-seventh can be attained.

In a twenty-ninth aspect of the invention, since a microlens is made by use of the photomask of the twenty-second, twenty-third, and/or twenty-fourth aspects, it is possible to obtain a microlens made in a desired shape such as a non-spherical surface shape, a shape capable of reducing aberration, or a shape of inclining an optical axis by an optional angle. Furthermore, a large number of lenses respectively having an equal diameter and different focal distance can be arranged on a single surface, or different optical parts such as a lens, prism, etc. can be formed as a same thing object at a same time. In particular, in the case of forming such optical parts in the shape of reducing aberration, it is also possible to obtain a microlens capable of being used for the purpose of requiring the fine light spot near the diffraction limit.

In a thirtieth aspect of the invention, since plural fine optical elements in the optical element assembly are arranged on one sheet of the base plate made by use of the photomask of the twenty-second, twenty-third, and/or twenty-fourth aspects, an apparatus employing such fine optical elements can be made small-sized.

The preferred embodiments of the present invention and the advantageous functional effects thereof over the background arts have been described heretofore. However, numerous additional modifications and variations of the present invention are possible in light of the above teachings. It is therefore to be understood that within the scope of the appended claims, the present invention may be practiced otherwise than as specifically described herein.

What is claimed is:

1. A photomask designing method employed for controlling intensity of light radiated onto a photoresist with a fine pattern which is a congregation of a fine area having a predetermined light transmission factor and for forming a three-dimensional-shaped resist pattern corresponding to said fine pattern on said photoresist, comprising the steps of:
   a resist sensitivity curve setting process of previously setting a resist sensitivity curve showing a resist depth of a pattern formed in said photoresist in relation to a light exposing amount for said photoresist;
   a fine area data setting process of previously setting fine area data corresponding to plural light transmission factors of a predetermined halftone component;
   a resist depth setting process of setting said resist depth per each of said fine areas based on a target resist pattern;
   an exposing amount calculating process of obtaining said light exposing amount per said fine area corresponding to said target resist pattern based on said resist depth set per said fine area and said resist sensitivity curve set in said resist sensitivity curve setting process;
   a light transmission factor converting process of converting said light exposure amount per said fine area obtained by said exposing amount calculating process to at least one of the light transmission factors; and
   a fine pattern creating process of creating said fine pattern by replacing the light transmission factor per said fine area obtained in said light transmission factor converting process by said fine area data which is set in said fine area data setting process.

2. A photomask designing method employed for controlling intensity of light radiated onto a photoresist with a fine pattern which is a congregation of a fine area having a predetermined light transmission factor and for forming a three-dimensional-shaped resist pattern corresponding to said fine pattern on said photoresist, comprising the steps of:
   a resist sensitivity curve setting process of previously setting a resist sensitivity curve showing a resist depth in relation to a light exposing amount for said photoresist;
   a fine area data setting process of previously setting fine area data corresponding to plural light transmission factors of a predetermined halftone component;
   a resist depth setting process of setting said resist depth per each of said fine areas based on a target resist pattern;
   an exposing amount calculating process of obtaining said light exposing amount per said fine area corresponding to said target resist pattern based on said resist depth set per said fine area and said resist sensitivity curve set in said resist sensitivity curve setting process;
   a light transmission factor converting process of converting said light exposure amount per said fine area obtained by said exposing amount calculating process to at least one of the light transmission factors; and
   a fine pattern creating process of creating said fine pattern by replacing the light transmission factor per said fine area obtained in said light transmission factor converting process by said fine area data which is set in said fine area data setting process,
   wherein, in said light transmission factor converting process, assuming that a maximum value of the exposure amount obtained in said exposure amount calculating process is Emax, a minimum value thereof is Emin, a minimum value of the light transmission factor which can be given to said fine area is a, a maximum value thereof is b, a maximum value of the light transmission factor converted in said light transmission factor converting process is Tmax, and a minimum value thereof is Tmin, a value of Eexp is set, Eexp satisfying:

$$Tmin + \frac{Emin}{Eexp} \times 100 \geq a \ (\%), \text{ and}$$

$$Tmax = \frac{Emax}{Eexp} \times 10 \leq b \ (\%),$$

and the set value of Eexp is converted to the light transmission factor by dividing said exposure amount per each fine area by said value of Eexp.

3. A photomask designing method as defined in claim 2, wherein, in said light transmission factor converting process, assuming that a light transmission factor which can be given to said fine area is T(n), wherein, n=1 . . . N, and T(n)<T(n+1), a resist depth for an exposure amount E is resist(E), and an accuracy required for said designed fine pattern is Δγ, a value of Eexp is set, Eexp satisfying:

$$\left| resist\left(\frac{T(n)}{100} \times Eexp\right) - resist\left(\frac{T(n+1)}{100} \times Eexp\right) \right| \leq \Delta\gamma,$$

and the set value of Eexp is converted to the light transmission factor by dividing said exposure amount per each fine area by said value of Eexp.

4. A photomask designing method employed for controlling intensity of light radiated onto a photoresist with a fine pattern which is a congregation of a fine area having a predetermined light transmission factor and for forming a three-dimensional-shaped resist pattern corresponding to said fine pattern on said photoresist, comprising the steps of:
   a resist sensitivity curve setting process of previously setting a resist sensitivity curve showing a resist depth in relation to a light exposing amount for said photoresist;

a fine area data setting process of previously setting fine area data corresponding to plural light transmission factors of a predetermined halftone component;

a resist depth setting process of setting said resist depth per each of said fine areas based on a target resist pattern;

an exposing amount calculating process of obtaining said light exposing amount per said fine area corresponding to said target resist pattern based on said resist depth set per said fine area and said resist sensitivity curve set in said resist sensitivity curve setting process;

a light transmission factor converting process of converting said light exposure amount per said fine area obtained by said exposing amount calculating process to at least one of the light transmission factors; and a fine pattern creating process of creating said fine pattern by replacing the light transmission factor per said fine area obtained in said light transmission factor converting process by said fine area data which is set in said fine area data setting process, wherein, in said resist depth setting process, the resist depth pattern per said fine area is moved such that a minimum value of the resist depth which is previously set increases.

5. A photomask designing method as defined in claim 2, wherein, in said resist depth setting process, the resist depth pattern per said fine area is moved such that a minimum value of the resist depth which is previously set increases.

6. A photomask designing method as defined in claim 3, wherein, in said resist depth setting process, the resist depth pattern per said fine area is moved such that a minimum value of the resist depth which is previously set increases.

7. A photomask designing method employed for controlling intensity of light radiated onto a photoresist with a fine pattern which is a congregation of a fine area having a predetermined light transmission factor and for forming a three-dimensional-shaped resist pattern corresponding to said fine pattern on said photoresist, comprising the steps of:

a resist sensitivity curve setting process of previously setting a resist sensitivity curve showing a resist depth in relation to a light exposing amount for said photoresist;

a fine area data setting process of previously setting fine area data corresponding to plural light transmission factors of a predetermined halftone component;

a resist depth setting process of setting said resist depth per each of said fine areas based on a target resist pattern;

an exposing amount calculating process of obtaining said light exposing amount per said fine area corresponding to said target resist pattern based on said resist depth set per said fine area and said resist sensitivity curve set in said resist sensitivity curve setting process;

a light transmission factor converting process of converting said light exposure amount per said fine area obtained by said exposing amount calculating process to at least one of the light transmission factors; and a fine pattern creating process of creating said fine pattern by replacing the light transmission factor per said fine area obtained in said light transmission factor converting process by said fine area data which is set in said fine area data setting process, wherein said fine pattern creating process comprises the substeps of:

a first compensation treatment process of calculating a light intensity distribution arriving onto said photoresist after being transmitted through said created fine pattern;

a second compensation treatment process of comparing the light intensity distribution per said fine area obtained in said first compensation treatment process with the light intensity based on the light transmission factor converted in said light intensity factor converting process; and a third compensation treatment process of replacing the light intensity by data of said fine area for decreasing an error when an error of the light intensity per said fine area is judged to occur in said second compensation treatment process.

8. A photomask designing method as defined in claim 2, wherein said fine pattern creating process comprises the substeps of:

a first compensation treatment process of calculating a light intensity distribution arriving at onto said photoresist after being transmitted through said created fine pattern;

a second compensation treatment process of comparing the light intensity distribution per said fine area obtained in said first compensation treatment process with the light intensity based on the light transmission factor converted in said light intensity factor converting process; and a third compensation treatment process of replacing the light intensity by data of said fine area for decreasing an error when an error of the light intensity per said fine area is judged to occur in said second compensation treatment process.

9. A photomask designing method as defined in claim 3, wherein said fine pattern creating process comprises the substeps of:

a first compensation treatment process of calculating a light intensity distribution arriving at onto said photoresist after being transmitted through said created fine pattern;

a second compensation treatment process of comparing the light intensity distribution per said fine area obtained in said first compensation treatment process with the light intensity based on the light transmission factor converted in said light intensity factor converting process; and a third compensation treatment process of replacing the light intensity by data of said fine area for decreasing an error when an error of the light intensity per said fine area is judged to occur in said second compensation treatment process.

10. A photomask designing method as defined in claim 4, wherein said fine pattern creating process comprises the substeps of:

a first compensation treatment process of calculating a light intensity distribution arriving onto said photoresist after being transmitted through said created fine pattern;

a second compensation treatment process of comparing the light intensity distribution per said fine area obtained in said first compensation treatment process with the light intensity based on the light transmission factor converted in said light intensity factor converting process; and a third compensation treatment process of replacing the light intensity by data of said fine area for decreasing an error when an error of the light intensity per said fine area is judged to occur in said second compensation treatment process.

11. A photomask designing method as defined in claim 7, wherein, in said fine pattern creating process, said first, second, and third compensation treatment processes are repeated several times.

12. A photomask designing method as defined in claim 7, wherein, in said fine pattern creating process, the calculation of the light intensity distribution in said first compensation treatment process is performed by use of:

$$int(x, y) = \int\int T(x+i, y+j)p(i, j)di\, dj,$$

in which int(x, y) is a light intensity on coordinates x and y, T(x, y) is a light transmission factor at a position corresponding to x, y on the photomask, and p(i, j) is a dotted-line distribution function representing a spread on the photoresist of light transmitted through a point on the photomask.

13. A photomask designing method as defined in claim 11, wherein, in said fine pattern forming process, the calculation of the light intensity distribution in said first compensation treatment process is performed by use of:

$$int(x, y) = \int\int T(x+i, y+j)p(i, j)di\, dj,$$

in which int(x, y) is the light intensity on coordinates x and y, T(x, y) is a light transmission factor at a position corresponding to x, y on the photomask, and p(i, j) is a dotted-line distribution function representing a spread on the photoresist of light transmitted through a point on the photomask.

14. A photomask designing apparatus employed for respectively controlling intensity of light radiated onto a photoresist with a fine pattern which is a congregation of a fine area having a predetermined light transmission factor and for forming a three-dimensional-shaped resist pattern corresponding to said fine pattern on said photoresist, comprising:

storing means for storing a resist sensitivity curve showing a resist depth of a pattern formed in said photoresist in relation to a light exposing amount for said photoresist and fine area data corresponding to plural light transmission factors of a predetermined halftone component;

resist depth setting means for setting said resist depth per each of said fine areas based on a target resist pattern;

exposing amount calculating means for obtaining said light exposing amount per said fine area corresponding to said target resist pattern based on said resist depth set per said fine area and said resist sensitivity curve stored in said storing means;

light transmission factor converting means for converting said light exposure amount per said fine area obtained by said exposing amount calculating means to at least one of the light transmission factors; and fine pattern creating means for creating said fine pattern by replacing the light transmission factor per said fine area obtained by said light transmission factor converting means by said fine area data which is stored in said storing means.

15. A photomask designing apparatus employed for respectively controlling intensity of light radiated onto a photoresist with a fine pattern which is a congregation of a fine area having a predetermined light transmission factor and for forming a three-dimensional-shaped resist pattern corresponding to said fine pattern on said photoresist, comprising:

storing means for storing a resist sensitivity curve showing a resist depth in relation to a light exposing amount for said photoresist and fine area data corresponding to plural light transmission factors of a predetermined halftone component;

resist depth setting means for setting said resist depth per each of said fine areas based on a target resist pattern;

exposing amount calculating means for obtaining said light exposing amount per said fine area corresponding to said target resist pattern based on said resist depth set per said fine area and said resist sensitivity curve stored in said storing means;

light transmission factor converting means for converting said light exposure amount per said fine area obtained by said exposing amount calculating means to at least one of the light transmission factors; and fine pattern creating means for creating said fine pattern by replacing the light transmission factor per said fine area obtained by said light transmission factor converting means by said fine area data which is stored in said storing means, wherein, assuming that a maximum value of the exposure amount obtained in said exposure amount calculating process is Emax, a minimum value thereof is Emin, a minimum value of the light transmission factor which can be given to said fine area is a, a maximum value thereof is b, a maximum value of the light transmission factor converted in said light transmission factor converting process is Tmax, and a minimum value thereof is Tmin, a value of Eexp is set, Eexp satisfying:

$$Tmin + \frac{Emin}{Eexp} \times 100 \geq a\ (\%),\ \text{and}$$

$$Tmax = \frac{Emax}{Eexp} \times 10 \leq b\ (\%),$$

and the set value of Eexp is converted to the light transmission factor by dividing said exposure amount per each fine area by said value of Eexp.

16. A photomask designing apparatus as defined in claim 15, wherein, assuming that the light transmission factor which can be given to said fine area is T(n), wherein n=1 . . . N, and T(n)<T(n+1), a resist depth for an exposure amount E is resist(E), and an accuracy required for said designed fine pattern is Δγ, a value of Eexp is set, Eexp satisfying:

$$\left| resist\left(\frac{T(n)}{100} \times Eexp\right) - resist\left(\frac{T(n+1)}{100} \times Eexp\right) \right| \leq \Delta\gamma,$$

and the set value of Eexp is converted to the light transmission factor by dividing said exposure amount per each fine area by said value of Eexp.

17. A photomask designing apparatus employed for respectively controlling intensity of light radiated onto a photoresist with a fine pattern which is a congregation of a fine area having a predetermined light transmission factor and for forming a three-dimensional-shaped resist pattern corresponding to said fine pattern on said photoresist, comprising:

storing means for storing a resist sensitivity curve showing a resist depth in relation to a light exposing amount for said photoresist and fine area data corresponding to plural light transmission factors of a predetermined halftone component;

resist depth setting means for setting said resist depth per each of said fine areas based on a target resist pattern;

exposing amount calculating means for obtaining said light exposing amount per said fine area corresponding to said target resist pattern based on said resist depth set per said fine area and said resist sensitivity curve stored in said storing means;

light transmission factor converting means for converting said light exposure amount per said fine area obtained by said exposing amount calculating means to at least one of the light transmission factors; and fine pattern creating means for creating said fine pattern by replacing the light transmission factor per said fine area obtained by said light transmission factor converting means by said fine area data which is stored in said storing means, wherein, said resist depth setting means moves the resist depth pattern per said fine area such that a minimum value of the resist depth which is previously set increases.

18. A photomask designing apparatus as defined in claim 15, wherein, said resist depth setting means moves the resist depth pattern per said fine area such that a minimum value of the resist depth which is previously set increases.

19. A photomask designing apparatus as defined in claim 16, wherein, said resist depth setting means moves the resist depth pattern per said fine area such that a minimum value of the resist depth which is previously set increases.

20. A photomask designing apparatus employed for respectively controlling intensity of light radiated onto a photoresist with a fine pattern which is a congregation of a fine area having a predetermined light transmission factor and for forming a three-dimensional-shaped resist pattern corresponding to said fine pattern on said photoresist, comprising:

storing means for storing a resist sensitivity curve showing a resist depth in relation to a light exposing amount for said photoresist and fine area data corresponding to plural light transmission factors of a predetermined halftone component;

resist depth setting means for setting said resist depth per each of said fine areas based on a target resist pattern;

exposing amount calculating means for obtaining said light exposing amount per said fine area corresponding to said target resist pattern based on said resist depth set per said fine area and said resist sensitivity curve stored in said storing means;

light transmission factor converting means for converting said light exposure amount per said fine area obtained by said exposing amount calculating means to at least one of the light transmission factors;

fine pattern creating means for creating said fin e pattern by replacing the light transmission factor per said fine are a obtained by said light transmission factor converting means by said fine area data which is stored in said storing means;

first compensation treatment means for calculating a light intensity distribution arriving onto said photoresist after being transmitted through said created fin e pattern;

second compensation treatment means for comparing the light intensity distribution per said fine area obtained in said first compensation treatment means with the light intensity based on the light transmission factor converted in said light intensity factor converting process; and third compensation treatment means for replacing the light intensity by data of said fine area for decreasing an error when an error of the light intensity per said fine area is judged to occur in said second compensation treatment means.

21. A photomask designing apparatus as defined in claim 15, further comprising:

first compensation treatment means for calculating a light intensity arriving onto said photoresist after being transmitted through said created fine pattern;

second compensation treatment means for comparing the light intensity distribution per said fine area obtained in said first compensation treatment means with the light intensity based on the light transmission factor converted in said light intensity factor converting process; and third compensation treatment means for replacing the light intensity by a data of said fine area for decreasing an error when an error of the light intensity per said fine area is judged to occur in said second compensation treatment means.

22. A photomask designing apparatus as defined in claim 16, further comprising:

first compensation treatment means for calculating a light intensity distribution arriving onto said photoresist after being transmitted through said created fine pattern;

second compensation treatment means for comparing the light intensity distribution per said fine area obtained in said first compensation treatment means with the light intensity based on the light transmission factor converted in said light intensity factor converting process; and third compensation treatment means for replacing the light intensity by data of said fine area for decreasing an error when an error of the light intensity per said fine area is judged to occur in said second compensation treatment means.

23. A photomask designing apparatus as defined in claim 17, further comprising:

first compensation treatment means for calculating the light intensity distribution arriving onto said photoresist after being transmitted through said created fine pattern;

second compensation treatment means for comparing the light intensity distribution per said fine area obtained in said first compensation treatment means with the light intensity based on the light transmission factor converted in said light intensity factor converting process; and third compensation treatment means for replacing the light intensity by data of said fine area for decreasing an error when an error of the light intensity per said fine area is judged to occur in said second compensation treatment means.

24. A photomask designing apparatus as defined in claim 20, wherein, said fine pattern creating means repeats several times the compensation treatment processes by said first, second, and third compensation treatment means.

25. A photomask designing apparatus as defined in claim 20, wherein, said fine pattern creating means performs the calculation of the light intensity distribution in said first compensation treatment means by use of:

$$int(x, y) = \iint T(x+i, y+j) p(i, j) \, di \, dj,$$

in which int(x, y) is a light intensity on a coordinates x and y, T(x, y) is a light transmission factor at a position corresponding to x, y on the photomask, and p(i, j) is a dotted-line distribution function representing a spread on the photoresist of a light transmitted through a point on the photomask.

26. A photomask designing apparatus as defined in claim 24, wherein, said fine pattern creating means performs the calculation of the light intensity distribution in said first compensation treatment means by use of:

$$int(x, y) = \iint T(x+i, y+j) p(i, j) \, di \, dj,$$

in which int(x, y) is a light intensity on coordinates x and y, T(x, y) is a light transmission factor at a position corresponding to x, y on the photomask, and p(i, j) is a dotted-line distribution function representing a spread on the photoresist of light transmitted through a point on the photomask.

27. A computer readable storing medium, wherein said storing medium is installed in a computer practicing a photomask designing process employed for controlling intensity of light radiated onto a photoresist with a fine pattern which is a congregation of a fine area having a predetermined light transmission factor and for forming a three-dimensional-shaped resist pattern corresponding to said fine pattern on said photoresist; and wherein a program stored in said computer readable storing medium causes said computer to practice a resist depth setting process of setting a resist depth per each of said fine areas based on a target resist pattern; an exposing amount calculating process of obtaining an exposing amount per said fine area corresponding to said target resist pattern based on said resist depth set per said fine area and a resist sensitivity curve showing the resist depth of a pattern formed in said photoresist in relation to a light exposing amount for said photoresist previously stored in a storage; a light transmission factor converting process of converting the exposure amount per said fine area obtained by said exposing amount calculating process to at least one of the light transmission factors; and a fine pattern creating process of creating said fine pattern by replacing the light transmission factor per said fine area obtained in said light transmission factor converting process by the fine area data caused to correspond to plural light transmission factors of predetermined halftone component previously stored in said storage.

28. A computer readable storing medium wherein said storing medium is installed in a computer practicing a photomask designing process employed for controlling intensity of light radiated onto a photoresist with a fine pattern which is a congregation of a fine area having a predetermined light transmission factor and for forming a three-dimensional-shaped resist pattern corresponding to said fine pattern on said photoresist; and wherein a program stored in said computer readable storing medium causes said computer to practice a resist depth setting process of setting a resist depth per each of said fine areas based on a target resist pattern; an exposing amount calculating process of obtaining an exposing amount per said fine area corresponding to said target resist pattern based on said resist depth set per said fine area and a resist sensitivity curve showing the resist depth for said photoresist exposing amount previously stored in a storage; a light transmission factor converting process of converting the exposure amount per said fine area obtained by said exposing amount calculating process to at least one of the light transmission factors; and a fine pattern creating process of creating said fine pattern by replacing the light transmission factor per said fine area obtained in said light transmission factor converting process by the fine area data caused to correspond to plural light transmission factors of predetermined halftone component previously stored in said storage, wherein, in said light transmission factor converting process, assuming that a maximum value of the exposure amount obtained in said exposure amount calculating process is Emax, a minimum value thereof is Emin, a minimum value of the light transmission factor which can be given to said fine area is a, a maximum value thereof is b, a maximum value of the light transmission factor converted in said light transmission factor converting process is Tmax, and a minimum value thereof is Tmin, the value of Eexp is set, Eexp satisfying:

$$Tmin + \frac{Emin}{Eexp} \times 100 \geq a \ (\%), \text{ and}$$

$$Tmax = \frac{Emax}{Eexp} \times 10 \leq b \ (\%),$$

and the set value of Eexp is converted to the light transmission factor by dividing said exposure amount per each fine area by said value of Eexp.

29. A computer readable storage medium as defined in claim 28, wherein, in said light transmission factor converting process, assuming that the light transmission factor which can be given to said fine area is T(n), wherein, n=1 . . . N, and T(n)<T(n+1), a resist depth for an exposure amount E is resist(E), and an accuracy required for said designed fine pattern is Δγ, a value of Eexp is set, Eexp satisfying:

$$\left| resist\left(\frac{T(n)}{100} \times Eexp\right) - resist\left(\frac{T(n+1)}{100} \times Eexp\right) \right| \leq \Delta\gamma,$$

and the set value of Eexp is converted to the light transmission factor by dividing said exposure amount per each fine area by said value of Eexp.

30. A computer readable storing medium wherein said storing medium is installed in a computer practicing a photomask designing process employed for controlling intensity of light radiated onto a photoresist with a fine pattern which is a congregation of a fine area having a predetermined light transmission factor and for forming a three-dimensional-shaped resist pattern corresponding to said fine pattern on said photoresist; and wherein a program stored in said computer readable storing medium causes said computer to practice a resist depth setting process of setting a resist depth per each of said fine areas based on a target resist pattern; an exposing amount calculating process of obtaining an exposing amount per said fine area corresponding to said target resist pattern based on said resist depth set per said fine area and a resist sensitivity curve showing the resist depth for said photoresist exposing amount previously stored in a storage; a light transmission factor converting process of converting the exposure amount per said fine area obtained by said exposing amount calculating process to at least one of the light transmission factors; and a fine pattern creating process of creating said fine pattern by replacing the light transmission factor per said fine area obtained in said light transmission factor converting process by the fine area data caused to correspond to plural light transmission factors of predetermined halftone component previously stored in said storage, wherein, said resist depth setting process, the resist depth pattern per said fine area is moved such that a minimum value of the resist depth which is previously set increases.

31. A computer readable storing medium as defined in claim 28, wherein, said resist depth setting process, the resist depth pattern per said fine area is moved such that a minimum value of the resist depth which is previously set increases.

32. A computer readable storing medium as defined in claim 29, wherein, said resist depth setting process, the resist depth pattern per said fine area is moved such that a minimum value of the resist depth which is previously set increases.

33. A computer readable storing medium wherein said storing medium is installed in a computer practicing a photomask designing process employed for controlling intensity of light radiated onto a photoresist with a fine pattern which is a congregation of a fine area having a predetermined light transmission factor and for forming a three-dimensional-shaped resist pattern corresponding to said fine pattern on said photoresist; and wherein a program stored in said computer readable storing medium causes said computer to practice a resist depth setting process of setting a resist depth per each of said fine areas based on a target resist pattern; an exposing amount calculating process of obtaining an exposing amount per said fine area corresponding to said target resist pattern based on said resist depth set per said fine area and a resist sensitivity curve showing the resist depth for said photoresist exposing amount previously stored in a storage; a light transmission factor converting process of converting the exposure amount per said fine area obtained by said exposing amount calculating process to at least one of the light transmission factors; and a fine pattern creating process of creating said fine pattern by replacing the light transmission factor per said fine area obtained in said light transmission factor converting process by the fine area data caused to correspond to plural light transmission factors of predetermined halftone component previously stored in said storage, wherein said fine pattern creating process comprises the substeps of:
   a first compensation treatment process of calculating the light intensity distribution arriving onto said photoresist after being transmitted through said created fine pattern;
   a second compensation treatment process of comparing the light intensity distribution per said fine area obtained in said first compensation treatment process with the light intensity based on the light transmission factor converted in said light intensity factor converting process; and
   a third compensation treatment process of replacing the light intensity by data of said fine area for decreasing an error when an error of the light intensity per said fine area is judged to occur in said second compensation treatment process.

34. A computer readable storing medium as defined in claim 28, wherein said fine pattern creating process comprises the substeps of:
   a first compensation treatment process of calculating the light intensity distribution arriving onto said photoresist after being transmitted through said created fine pattern;
   a second compensation treatment process of comparing the light intensity distribution per said fine area obtained in said first compensation treatment process with the light intensity based on the light transmission factor converted in said light intensity factor converting process; and
   a third compensation treatment process of replacing the light intensity by data of said fine area for decreasing an error when an error of the light intensity per said fine area is judged to occur in said second compensation treatment process.

35. A computer readable storing medium as defined in claim 29, wherein said fine pattern creating process comprises the substeps of:
   a first compensation treatment process of calculating the light intensity distribution arriving onto said photoresist after being transmitted through said created fine pattern;
   a second compensation treatment process of comparing the light intensity distribution per said fine area obtained in said first compensation treatment process with the light intensity based on the light transmission factor converted in said light intensity factor converting process; and
   a third compensation treatment process of replacing the light intensity by data of said fine area for decreasing an error when an error of the light intensity per s aid fine area is judged to occur in said second compensation treatment process.

36. A computer readable storing medium as defined in claim 30, wherein said fine pattern creating process comprises the substeps of:
   a first compensation treatment process of calculating the light intensity distribution arriving onto said photoresist after being transmitted through said created fine pattern;
   a second compensation treatment process of comparing the light intensity distribution per said fine area obtained in said first compensation treatment process with the light intensity based on the light transmission factor converted in said light intensity factor converting process; and
   a third compensation treatment process of replacing the light intensity by data of said fine area for decreasing an error when an error of the light intensity per said fine area is judged to occur in said second compensation treatment process.

37. A computer readable storing medium as defined in claim 33,
wherein, in said fine pattern creating process, said first, second, and third compensation treatment processes are repeated several times.

38. A computer readable storing medium as defined in claim 33,
wherein, in said fine pattern creating means performs the calculation of the light intensity distribution in said first compensation treatment process by us e of:

$$int(x, y) = \iint T(x+i, y+j)p(i, j)di\, dj,$$

in which int(x, y) is a light intensity on coordinates x and y, T(x, y) is a light transmission factor at a position corresponding to x, y on the photomask, and p(i, j) is a dotted-line distribution function representing a spread on the photoresist of a light transmitted through a point on the photomask.

39. A computer readable storing medium as defined in claim 37,
wherein, in said fine pattern creating means performs the calculation of the light intensity distribution in said first compensation treatment process by use of:

$$int(x, y) = \iint T(x+i, y+j)p(i, j)di\, dj,$$

in which int(x, y) is a light intensity on coordinates x and y, T(x, y) is a light transmission factor at a position corresponding to x, y on the photomask, and p(i, j) is a dotted-line distribution function representing a spread on the photoresist of light transmitted through a point on the photomask.

40. A photomask designed by use of said photomask designing method as defined in claim 1.

41. A photomask as defined in claim 22,
wherein the light transmission factor changes scatteringly.

42. A photomask as defined in claim 23,
wherein said photomask is made of the material which changes binarily between 100 percent and 0 percent; and
wherein the light transmission factor is changed by changing a size of an opening portion disposed on said fine area.

43. A photoresist exposed by use of the photomask as defined in claim 40.

44. A photosensitive resin exposed by use of the photomask as defined in claim 40.

45. A base plate to which the photoresist as defined in claim 43 is transferred, utilizing a method of a anisotropy dry-etching.

46. A base plate to which the photosensitive resin pattern as defined in claim 44 is transferred, utilizing a method of anisotropy dry-etching.

47. A microlens made by use of the photomask as defined in claim 40.

48. An optical element assembly in which plural fine optical elements are arranged on one sheet of a base plate made by use of the photomask as defined in claim 40.

49. A computer readable storing medium,
wherein said storing medium is installed in a computer practicing a photomask designing process employed for controlling intensity of light radiated onto a photoresist with a fine pattern which is a congregation of a fine area having a predetermined light transmission factor and for forming a three-dimensional-shaped resist pattern corresponding to said fine pattern on said photoresist; and
wherein a program stored in said computer readable storing medium is practiced in said computer by use of:
resist depth setting means for setting a resist depth per each of said fine areas based on a target resist pattern;
exposing amount calculating means for obtaining said exposing amount per said fine area corresponding to said target resist pattern based on said resist depth set per said fine area and a resist sensitivity curve showing the resist depth of a pattern formed in said photoresist in relation to a light exposing amount for said photoresist previously stored in storage means;
light transmission factor converting means for converting the exposure amount per said fine area obtained by said exposing amount calculating process to the light transmission factor; and
fine pattern creating means for creating said fine pattern by replacing the light transmission factor per said fine area obtained in said light transmission factor converting process by the fine area data caused to correspond to plural light transmission factors of a predetermined halftone component previously stored in said storage means.

50. A computer readable storing medium
wherein said storing medium is installed in a computer practicing a photomask designing process employed for controlling intensity of light radiated onto a photoresist with a fine pattern which is a congregation of a fine area having a predetermined light transmission factor and for forming a three-dimensional-shaped resist pattern corresponding to said fine pattern on said photoresist; and
wherein a program stored in said computer readable storing medium is practiced in said computer by use of:
resist depth setting means for setting a resist depth per each of said fine areas based on a target resist pattern;
exposing amount calculating means for obtaining said exposing amount per said fine area corresponding to said target resist pattern based on said resist depth set per said fine area and a resist sensitivity curve showing the resist depth for said photoresist exposing amount previously stored in storage means;
light transmission factor converting means for converting the exposure amount per said fine area obtained by said exposing amount calculating process to the light transmission factor; and
fine pattern creating means for creating said fine pattern by replacing the light transmission factor per said fine area obtained in said light transmission factor converting process by the fine area data caused to correspond to plural light transmission factors of a predetermined halftone component previously stored in said storage means,
wherein, in said light transmission factor converting process, assuming that a maximum value of the exposure amount obtained in said exposure amount calculating process is Emax, a minimum value thereof is Emin, a minimum value of the light transmission factor which can be given to said fine area is a, a maximum value thereof is b, a maximum value of the light transmission factor converted in said light transmission factor converting process is Tmax, and a minimum value thereof is Tmin, a value of Eexp is set, Eexp satisfying:

$$Tmin + \frac{Emin}{Eexp} \times 100 \geq a \ (\%), \text{ and}$$

$$Tmax = \frac{Emax}{Eexp} \times 10 \leq b \ (\%),$$

and the set value of Eexp is converted to the light transmission factor by dividing said exposure amount per each fine area by said value of Eexp.

51. A computer readable storing medium as defined in claim 50, wherein, in said light transmission factor converting process, assuming that the light transmission factor which can be given to said fine area is T(n), wherein, n=1 ... N, and T(n)<T(n+1), a resist depth for exposure amount E is resist(E), and an accuracy required for said designed fine pattern is Δγ, the value of Eexp is set, Eexp satisfying:

$$\left| resist\left(\frac{T(n)}{100} \times Eexp\right) - resist\left(\frac{T(n+1)}{100} \times Eexp\right) \right| \leq \Delta\gamma,$$

and the set value of Eexp is converted to the light transmission factor by dividing said exposure amount per each fine area by said value of Eexp.

* * * * *